United States Patent
Shin et al.

(10) Patent No.: US 12,272,419 B2
(45) Date of Patent: Apr. 8, 2025

(54) CHARGE PUMP HAVING SWITCH CIRCUITS FOR BLOCKING LEAKAGE CURRENT DURING SUDDEN POWER-OFF, AND FLASH MEMORY INCLUDING THE SAME

(71) Applicant: Samsung Electronics Co., Ltd., Suwon-si (KR)

(72) Inventors: Yeji Shin, Suwon-si (KR); Tae-Hong Kwon, Suwon-si (KR); Yoonjae Lee, Suwon-si (KR); Seokin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/217,087

(22) Filed: Jun. 30, 2023

(65) Prior Publication Data

US 2024/0127865 A1     Apr. 18, 2024

(51) Int. Cl.
  *G11C 5/14* (2006.01)
  *G11C 16/12* (2006.01)
  *G11C 16/30* (2006.01)

(52) U.S. Cl.
  CPC .............. *G11C 5/145* (2013.01); *G11C 16/12* (2013.01); *G11C 16/30* (2013.01)

(58) Field of Classification Search
  CPC ........................................................ G11C 5/145
  (Continued)

(56) References Cited

U.S. PATENT DOCUMENTS

| 5,602,794 A | 2/1997 | Javanifard et al. |
| 5,732,039 A | 3/1998 | Javanifard et al. |

(Continued)

FOREIGN PATENT DOCUMENTS

| CN | 103329414 A | 9/2013 |
| CN | 106105001 A | 11/2016 |

(Continued)

OTHER PUBLICATIONS

A. Khakifirooz et al., "30.2 A 1Tb 4b/Cell 144-Tier Floating-Gate 3D-NAND Flash Memory with 40MB/s Program Throughput and 13.8Gb/mm2 Bit Density," 2021 IEEE International Solid- State Circuits Conference (ISSCC), San Francisco, CA, USA, 2021, pp. 424-426.

C. Siau et al., "13.5 A 512Gb 3-bit/Cell 3D Flash Memory on 128-Wordline-Layer with 132MB/s Write Performance Featuring Circuit-Under-Array Technology," 2019 IEEE International Solid-State Circuits Conference—(ISSCC), San Francisco, CA, USA, 2019, pp. 218-220.

(Continued)

*Primary Examiner* — Tomi Skibinski
(74) *Attorney, Agent, or Firm* — Muir Patent Law, PLLC

(57) ABSTRACT

Disclosed is a charge pump of a flash memory, which includes a first stage pump that is connected between an output terminal and a first pump node, and a second stage pump that is connected between the first pump node and a second pump node. The first stage pump includes a first switch circuit that is connected between a power terminal and the first pump node and provides a power supply voltage to the first pump node in response to a first stage signal, in a normal operation, and a first pump circuit that generates a first pumping voltage by using a voltage of the first pump node in response to a first clock signal and provides the first pumping voltage to the output terminal. The first switch circuit blocks a current flow from the first pump node to the power terminal in a sudden power-off event.

20 Claims, 17 Drawing Sheets

(58) Field of Classification Search
USPC .......................................................... 327/536
See application file for complete search history.

(56) References Cited

U.S. PATENT DOCUMENTS

| | | |
|---|---|---|
| 6,486,728 B2 | 11/2002 | Kleveland |
| 6,878,981 B2 | 4/2005 | Eshel |
| 6,927,441 B2 | 8/2005 | Pappalardo et al. |
| 6,980,045 B1 | 12/2005 | Liu |
| 6,985,397 B2 | 1/2006 | Tokui et al. |
| 7,023,260 B2 | 4/2006 | Thorp et al. |
| 7,098,725 B2 | 8/2006 | Lee |
| 7,595,682 B2 | 9/2009 | Lin et al. |
| 7,696,812 B2 | 4/2010 | Al-Shamma et al. |
| 7,956,673 B2 | 6/2011 | Pan |
| 7,969,235 B2 | 6/2011 | Pan |
| 8,085,086 B1 | 12/2011 | Lin et al. |
| 8,232,833 B2 | 7/2012 | Tran et al. |
| 8,339,185 B2 | 12/2012 | Cazzaniga et al. |
| 8,421,524 B2 | 4/2013 | Pan et al. |
| 9,154,027 B2 | 10/2015 | Huynh et al. |
| 9,337,724 B2 | 5/2016 | Miller |
| 10,892,680 B2 | 1/2021 | Piccardi et al. |
| 2003/0151432 A1 | 8/2003 | Pelliconi |
| 2005/0237103 A1 | 10/2005 | Cernea |
| 2007/0146052 A1 | 6/2007 | Byeon |
| 2008/0042731 A1 | 2/2008 | Daga et al. |
| 2010/0219881 A1 | 9/2010 | Chen et al. |
| 2011/0018617 A1 | 1/2011 | Htoo et al. |
| 2011/0133820 A1 | 6/2011 | Pan |
| 2011/0221514 A1 | 9/2011 | Pan |
| 2021/0057993 A1 | 2/2021 | Piccardi et al. |
| 2022/0158550 A1* | 5/2022 | Rana ...................... G11C 16/30 |

FOREIGN PATENT DOCUMENTS

| | | |
|---|---|---|
| EP | 1559186 A2 | 8/2005 |
| JP | 2000123587 A | 4/2000 |
| JP | 2004304913 A | 10/2004 |
| KR | 100297679 B1 | 8/2001 |

OTHER PUBLICATIONS

H. Maejima et al., "A 512Gb 3b/Cell 3D flash memory on a 96-word-line-layer technology," 2018 IEEE International Solid-State Circuits Conference—(ISSCC), San Francisco, CA, USA, 2018, pp. 336-338.

Huang, Cece, et al., "A 1.2mV ripple, 4.5V charge pump using controllable pumping current technology," IEICE Electronics Express, pp. 1-6 (2017) vol. 14.

J.-W. Park et al., "30.1 A 176-Stacked 512Gb 3b/Cell 3D-NAND Flash with 10.8Gb/mm2 Density with a Peripheral Circuit Under Cell Array Architecture," 2021 IEEE International Solid-State Circuits Conference (ISSCC), San Francisco, CA, USA, 2021, pp. 422-423.

Jae-Yul Lee, et. al., "A regulated charge pump with small ripple voltage and fast start-up," IEEE Journal of Solid- State Circuits, Feb. 2006, pp. 425-432, vol. 41, No. 2.

N. Shibata et al., "13.1 A 1.33Tb 4-bit/Cell 3D-Flash Memory on a 96-Word-Line-Layer Technology," 2019 IEEE International Solid-State Circuits Conference—(ISSCC), San Francisco, CA, USA, 2019, pp. 210-212.

S.-W. Kim, et. al., "A High Efficiency Variable Stage and Frequency Charge Pump for Wide Range ISPP," 2020 IEEE International Symposium on Circuits and Systems (ISCAS), Seville, Spain, 2020, pp. 1-5.

T. Higuchi et al., "30.4 A 1Tb 3b/Cell 3D-Flash Memory in a 170+ Word-Line-Layer Technology," 2021 IEEE International Solid-State Circuits Conference (ISSCC), San Francisco, CA, USA, 2021, pp. 428-430.

T. Kouchi et al., "13.5 A 128Gb 1b/Cell 96-Word-Line-Layer 3D Flash Memory to Improve Random Read Latency with tPROG= 75μs and tR=4μs," 2020 IEEE International Solid-State Circuits Conference—(ISSCC), San Francisco, CA, USA, 2020, pp. 226-228.

T. Tanaka et al., "7.7 A 768Gb 3b/cell 3D-floating-gate NAND flash memory," 2016 IEEE International Solid-State Circuits Conference (ISSCC), San Francisco, CA, USA, 2016, pp. 142-144.

* cited by examiner

CHARGE PUMP HAVING SWITCH CIRCUITS FOR BLOCKING LEAKAGE CURRENT DURING SUDDEN POWER-OFF, AND FLASH MEMORY INCLUDING THE SAME

CROSS-REFERENCE TO RELATED APPLICATIONS

This application claims priority under 35 U.S.C. § 119 to Korean Patent Application No. 10-2022-0130361 filed on Oct. 12, 2022, in the Korean Intellectual Property Office, the disclosures of which are incorporated by reference herein in their entireties.

BACKGROUND

Embodiments of the present disclosure described herein relate to a semiconductor memory device, and more particularly, relate to a charge pump including a switch circuit blocking a leakage current in a sudden power-off event and a flash memory including the same.

A semiconductor memory may be mainly classified as a volatile memory or a non-volatile memory. A read or write speed of the volatile memory (e.g., a DRAM or an SRAM) is fast, but data stored in the volatile memory disappear when a power is turned off. In contrast, the non-volatile memory may retain data even when the power is turned off.

A representative example of the non-volatile memory is a flash memory. The flash memory may store multi-bit data of two or more bits in one memory cell. The flash memory that stores the multi-bit data may have one erase state and a plurality of program states depending on threshold voltage distributions. The flash memory requires various levels of high voltages for the purpose of reading or writing multi-bit data.

The flash memory may generate various levels of high voltages for the read or write operation by using a charge pump. For example, the flash memory requires a program voltage (Vpgm) or a pass voltage (Vpass) for the purpose of performing the program operation. The flash memory requires a read voltage (Vrd) or a read pass voltage (Vrdps) for the purpose of performing the read operation. The flash memory may generate the high voltages including the program voltage by using the charge pump.

Meanwhile, the sudden power-off event that the power is turned off suddenly while the flash memory performs the program or read operation may occur in the flash memory. When the sudden power-off event occurs, a great voltage difference may occur between nodes in the charge pump. Internal elements of the charge pump may experience the breakdown due to the great voltage difference. As the storage capacity of the flash memory continuously increases, the pumping capacity of the charge pump may also increase, and the internal elements of the charge pump may experience the breakdown more easily.

SUMMARY

Embodiments of the present disclosure provide a charge pump including a switch circuit blocking a leakage current in a sudden power-off event. Also, embodiments of the present disclosure provide a charge pump capable of protecting internal elements from the breakdown by providing a discharge path in a sudden power-off event and a flash memory including the same.

According to an embodiment, a charge pump of a flash memory includes an output terminal, a first stage pump connected between the output terminal and a first pump node, and a second stage pump connected between the first pump node and a second pump node. The first stage pump includes a first switch circuit connected between a power terminal and the first pump node, and a first pump circuit connected to the first pump node. The first pump circuit generates a first pumping voltage by using a voltage of the first pump node in response to a first clock signal, and provides the first pumping voltage to the output terminal. The first switch circuit provides, in a normal operation, a power supply voltage from the power terminal to the first pump node in response to a first stage signal, and blocks, in a sudden power-off event, a current flow from the first pump node to the power terminal.

According to an embodiment, a flash memory includes a charge pump including a plurality of stage pumps that are configured to generate an output voltage, and a word line voltage generator connected to the charge pump and configured to generate a word line voltage by using the output voltage of the charge pump. Each stage pump of the plurality of stage pumps includes a pump circuit configured to generate a pumping voltage in response to a clock signal, and a switch circuit connected between a power terminal and the pump circuit. The switch circuit provides, in a normal operation, a power supply voltage to the pump circuit in response to a stage signal, and blocks, in a sudden power-off event, a current flow from the pump circuit to the power terminal.

According to an embodiment, a storage device includes a flash memory including a memory cell array and a peripheral circuit, and a memory controller configured to control the flash memory. The peripheral circuit of the flash memory includes a charge pump including a plurality of stage pumps that are configured to generate an output voltage, and a word line voltage generator connected to the charge pump. The word line voltage generator generates a word line voltage by using an output voltage of the charge pump, and provides the word line voltage to the memory cell array. Each stage pump of the plurality of stage pumps includes a pump circuit configured to generate a pumping voltage in response to a clock signal, and a switch circuit connected between a power terminal of the charge pump and the pump circuit. The switch circuit provides, in a normal operation, a power supply voltage to the pump circuit in response to a stage signal, and blocks, in a sudden power-off event, a current flow from the pump circuit to the power terminal.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily implements the invention.

Figure 1:
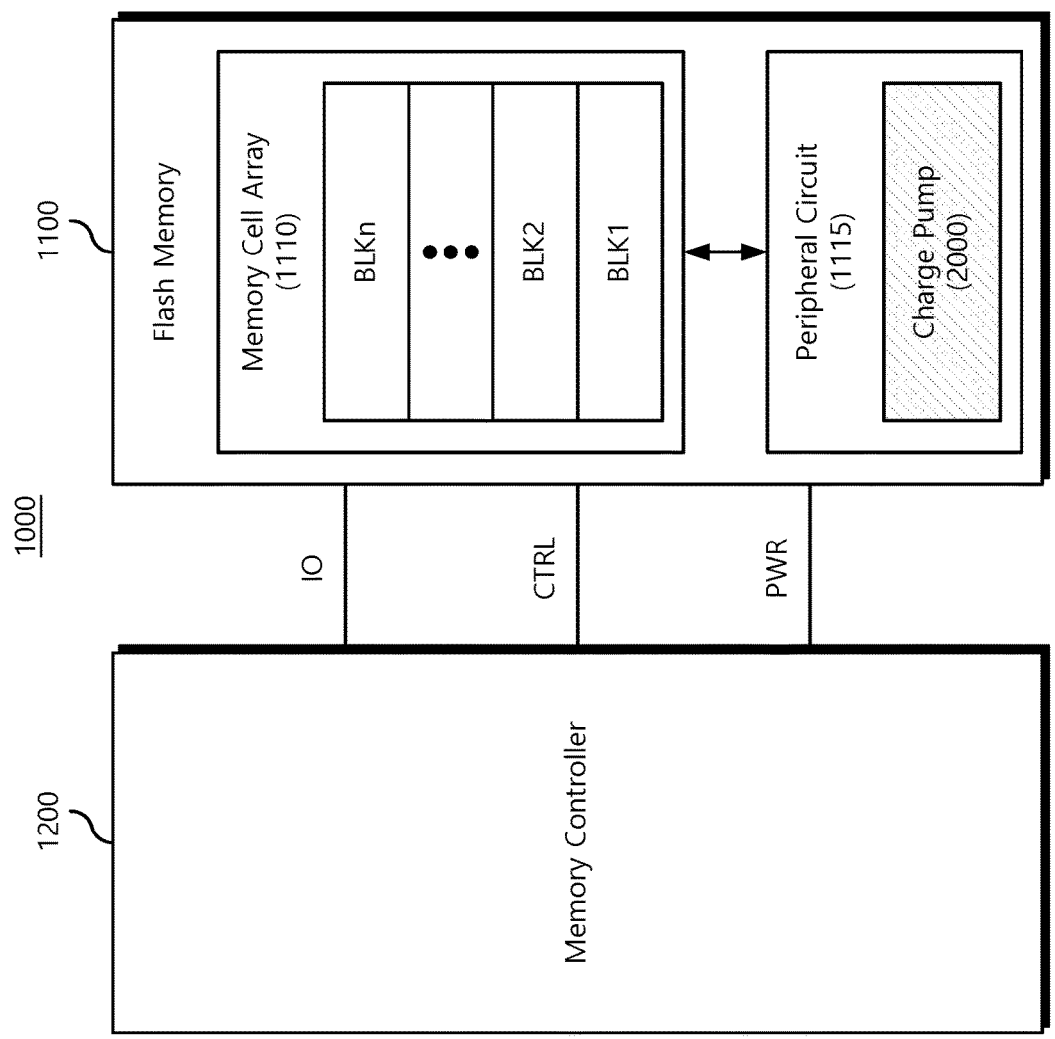
FIG. 1 is a block diagram illustrating a storage device according to an embodiment of the present disclosure.

FIG. 1 is a block diagram illustrating a storage device according to an embodiment of the present disclosure. A storage device 1000 may be a flash storage device that is based on a flash memory 1100. For example, the storage device 1000 may refer to a solid state drive (SSD), universal flash storage (UFS), or a memory card.

Referring to FIG. 1, the storage device 1000 includes the flash memory 1100 and a memory controller 1200. The flash memory 1100 and the memory controller 1200 may be connected through a data input/output line IO, a control line CTRL, and a power line PWR. Under control of the memory controller 1200, the storage device 1000 may store data in the flash memory 1100.

The flash memory 1100 includes a memory cell array 1110 and a peripheral circuit 1115. The memory cell array 1110 may include a plurality of memory blocks BLK1 to BLKn. Each of the memory blocks BLK1 to BLKn may have a vertical three-dimensional structure. Each of the memory blocks BLK1 to BLKn may include a plurality of memory cells. Multi-bit data may be stored in each of the memory cells.

The memory cell array 1110 may be placed next to the peripheral circuit 1115 or on the peripheral circuit 1115 in a design/layout structure. A structure in which the memory cell array 1110 is placed on the peripheral circuit 1115 is called a cell on peripheral (COP) structure. Meanwhile, the memory cell array 1110 may be implemented with a chip that is independent of the peripheral circuit 1115. An upper chip including the memory cell array 1110 and a lower chip including the peripheral circuit 1115 may be coupled to each other by a bonding scheme. This structure is called a chip to chip (C2C) structure.

The peripheral circuit 1115 may include analog circuits, digital circuits, or the analog and digital circuits, which operate to store data in the memory cell array 1110 or to read data stored in the memory cell array 1110. The peripheral circuit 1115 may be supplied with an external power PWR from the memory controller 1200 and may generate internal powers (e.g., VCC) of various levels.

The peripheral circuit 1115 may receive a command, an address, and data from the memory controller 1200 through the data input/output line TO. The peripheral circuit 1115 may store data in the memory cell array 1110 in response to a control signal CTRL. Also, the peripheral circuit 1115 may read data stored in the memory cell array 1110 and may provide the read data to the memory controller 1200.

The peripheral circuit 1115 may include a charge pump 2000. The charge pump 2000 may include a plurality of stage pumps. The charge pump 2000 may generate a desired output voltage by allowing the plurality of stage pumps to sequentially operate from an output terminal depending on a clock signal.

The charge pump 2000 according to an embodiment of the present disclosure may generate a desired output voltage by using the plurality of stage pumps in a normal operation. The charge pump 2000 may quickly discharge charges charged therein through a discharge path in the sudden power-off event. As the charge pump 2000 quickly discharges the charged charges in the sudden power-off event, the breakdown of internal elements of the charge pump 2000 may be prevented.

Figure 2:
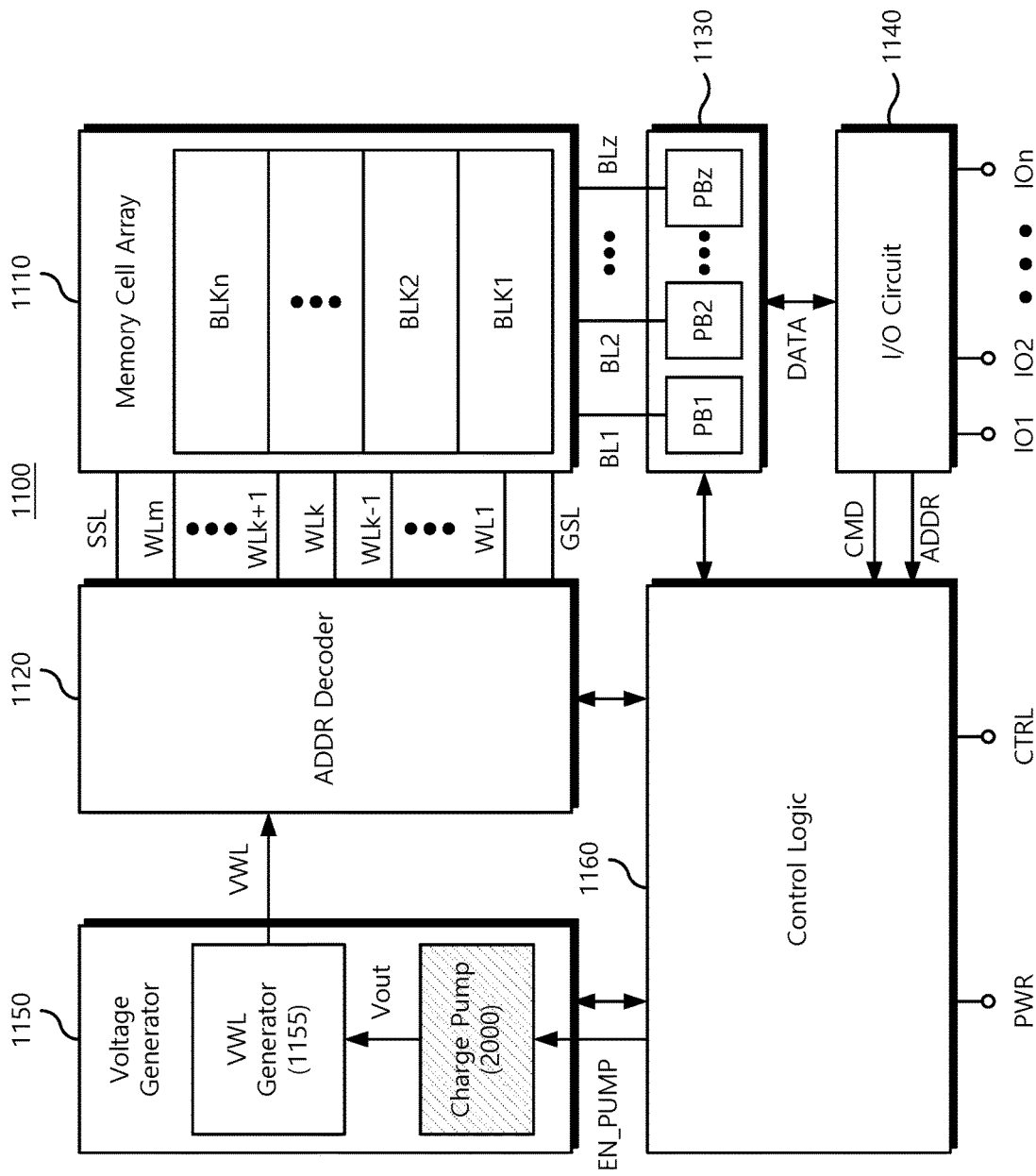
FIG. 2 is a block diagram illustrating a flash memory illustrated in FIG. 1.

FIG. 2 is a block diagram illustrating a flash memory illustrated in FIG. 1. Referring to FIG. 2, the flash memory 1100 may include the memory cell array 1110, an address decoder 1120, a page buffer circuit 1130, an input/output (I/O) circuit 1140, a voltage generator 1150, and control logic 1160.

The memory cell array 1110 may include the plurality of memory blocks BLK1 to BLKn. Each of the memory blocks BLK1 to BLKn may include a plurality of pages. Each page may be composed of a plurality of memory cells. Multi-bit data may be stored in each of the memory cells. Each memory block may correspond to an erase unit, and each page may correspond to a read or write unit.

The memory cell array 1110 may be formed in a direction perpendicular to a substrate. A gate electrode layer and an insulation layer may be alternately deposited on the substrate. Each memory block (e.g., the memory block BLK1) may be connected with a string selection line SSL, a plurality of word lines WL1 to WLm, and a ground selection line GSL.

The address decoder 1120 may be connected with the memory cell array 1110 through the selection lines SSL and GSL and the word lines WL1 to WLm. The address decoder 1120 may select a word line in the program or read operation. The address decoder 1120 may receive a word line voltage VWL from the voltage generator 1150 and may provide the selected word line with a program voltage or a read voltage.

The page buffer circuit 1130 may be connected with the memory cell array 1110 through bit lines BL1 to BLz. The page buffer circuit 1130 may temporarily store data to be programmed in the memory cell array 1110 or data read from the memory cell array 1110. The page buffer circuit 1130 may include page buffers PB1 to PBz that are respectively connected with the bit lines BL1 to BLz. Each of the page buffers PB1 to PBz may include a plurality of latches for the purpose of storing or reading multi-bit data.

The input/output circuit 1140 may be connected with the page buffer circuit 1130 through data lines and may be connected with the memory controller 1200 (refer to FIG. 1) through input/output lines 101 to Ion. During the program operation, the input/output circuit 1140 may receive program data from the memory controller 1200. During the read operation, the input/output circuit 1140 may provide the memory controller 1200 with the data read from the memory cell array 1110.

The voltage generator 1150 may be supplied with an internal power from the control logic 1160 and may generate the word line voltage VWL necessary to read or write data. The word line voltage VWL may be provided to a selected word line sWL or an unselected word line uWL through the address decoder 1120.

The voltage generator 1150 may include a word line voltage generator 1155. The word line voltage generator 1155 may include a program voltage (Vpgm) generator and a pass voltage (Vpass) generator. The program voltage generator may generate a program voltage Vpgm that is provided to the selected word line sWL during the program operation. The pass voltage generator may generate a pass voltage Vpass that is provided to the selected word line sWL and the unselected word line uWL.

The voltage generator 1150 may further include a read voltage (Vrd) generator and a read pass voltage (Vrdps) generator. The read voltage generator may generate a selection read voltage Vrd that is provided to the selected word line sWL during the read operation. The read pass voltage generator may generate a read pass voltage Vrdps that is provided to the unselected word line uWL. The read pass voltage Vrdps may refer to a voltage sufficient to turn on memory cells connected with the unselected word line uWL during the read operation.

The voltage generator 1150 may include the charge pump 2000. The charge pump 2000 may operate in response to a pump enable signal EN_PUMP from the control logic 1160. The charge pump 2000 may receive a power supply voltage VCC and may provide an output voltage Vout to the word line voltage generator 1155. An internal configuration and an operation principle of the charge pump 2000 will be described in detail later.

The control logic 1160 may control the read, write, and erase operations of the flash memory 1100 by using the command CMD, the address ADDR, and the control signal CTRL provided from the memory controller 1200. The control logic 1160 may control the voltage generator 1150 by using the pump enable signal EN_PUMP such that the voltage generator 1150 generates voltages necessary for the read, write, and erase operations.

Figure 3:
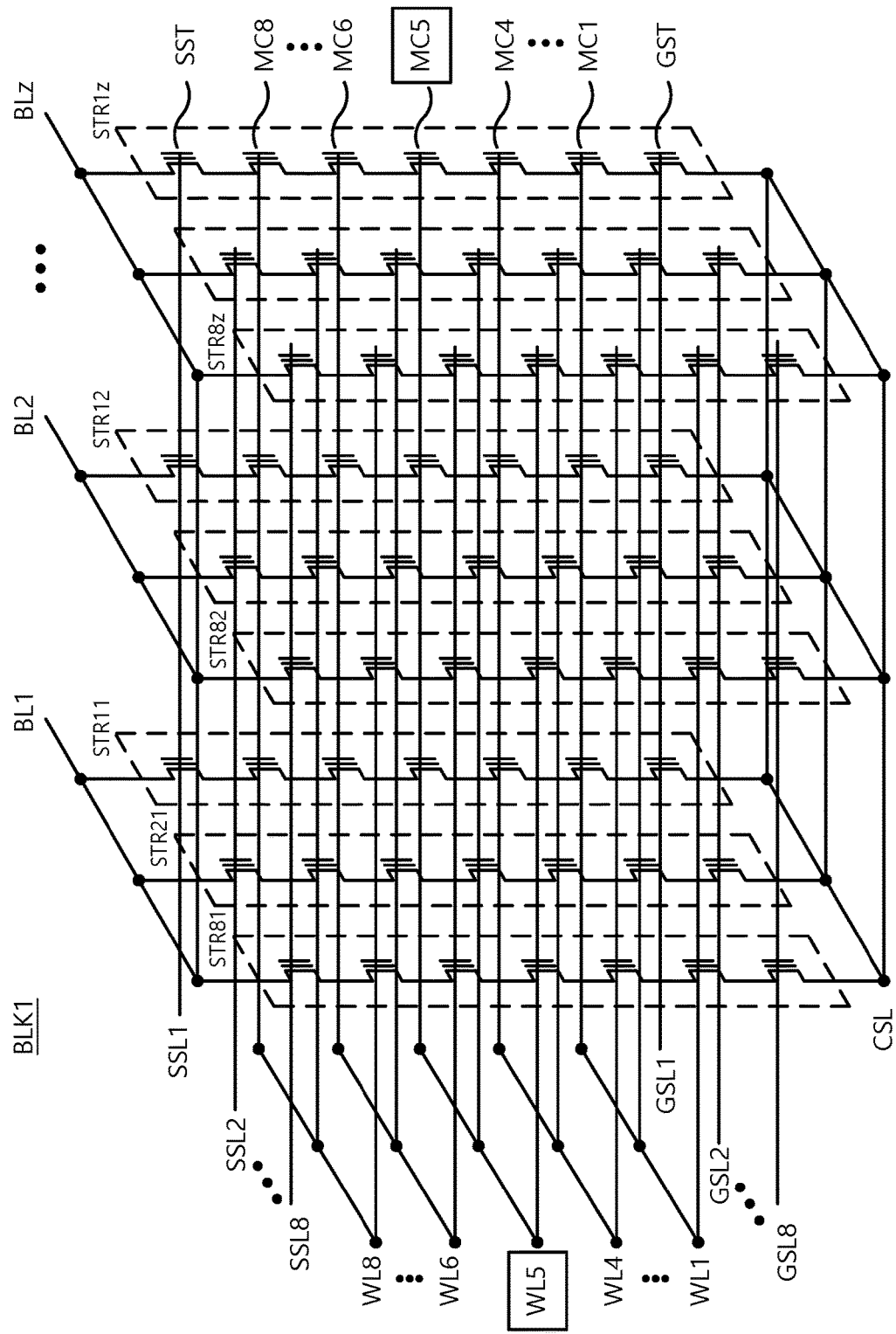
FIG. 3 is a circuit diagram illustrating a memory block of a memory cell array of FIG. 2.

FIG. 3 is a circuit diagram illustrating a memory block of a memory cell array of FIG. 2. Referring to FIG. 3, the memory block BLK1 may include 11-th to 8z-th cell strings STR11 to STR8z formed between the bit lines BL1 to BLz and a common source line CSL. Each cell string includes a string selection transistor SST, first to eighth memory cells MC1 to MC8, and a ground selection transistor GST.

The string selection transistors SST may be connected with first to eighth string selection lines SSL1 to SSL8. The ground selection transistors GST may be connected with first to eighth ground selection lines GSL1 to GSL8. The string selection transistors SST may be connected with the first to z-th bit lines BL1 to BLz. The ground selection transistors GST are connected with the common source line CSL.

First to eighth word lines WL1 to WL8 may be connected with the first to eighth memory cells MC1 to MC8 in a row direction. The first to z-th bit lines BL1 to BLz may be connected with the first to eighth memory cells MC1 to MC8 in a column direction.

The first word line WL1 may be placed above the first to eighth ground selection lines GSL1 to GSL8. The first memory cells MC1 that are placed at the same height from the substrate may be connected with the first word line WL1. Likewise, the second to eighth memory cells MC2 to MC8 that are placed at the same heights from the substrate may be respectively connected with the second to eighth word lines WL2 to WL8.

Figure 4:
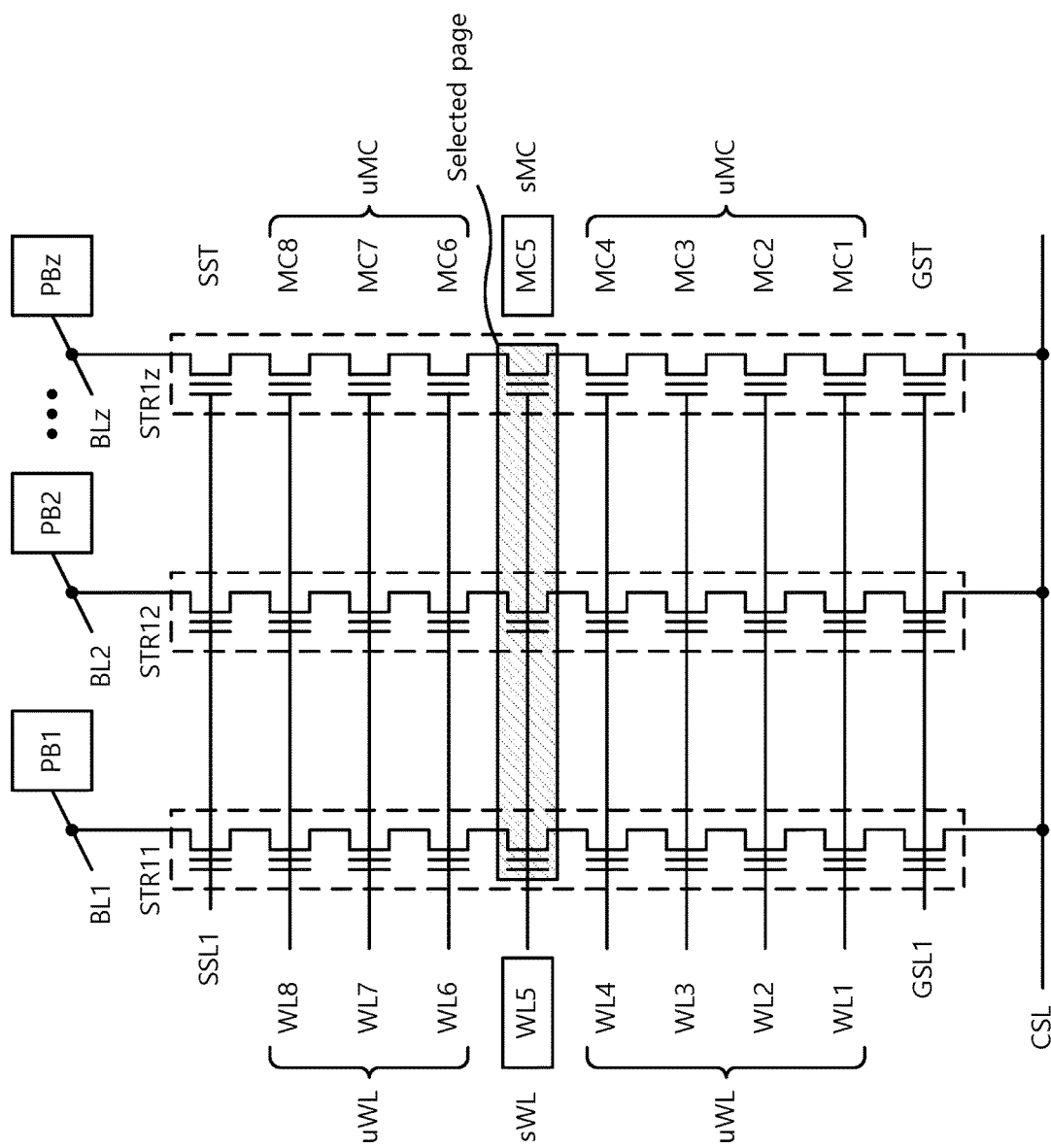
FIG. 4 is a circuit diagram illustrating cell strings selected by a first string selection line from among cell strings of a memory block illustrated in FIG. 3.

FIG. 4 is a circuit diagram illustrating cell strings selected by the first string selection line SSL1 from among cell strings of the memory block BLK1 illustrated in FIG. 3. The 11st to 1z-th cell strings STR11 to STR1z may be selected by the first string selection line SSL1. The 11st to 1z-th cell strings STR11 to STR1z may be respectively connected with the first to z-th bit lines BL1 to BLz. First to z-th page buffers PB1 to PBz may be respectively connected with the first to z-th bit lines BL1 to BLz.

The $11^{th}$ cell string STR11 is connected with the first bit line BL1 and the common source line CSL. The string selection transistor SST selected by the first string selection line SSL1, the first to eighth memory cells MC1 to MC8 connected with the first to eighth word lines WL1 to WL8, and the ground selection transistors GST selected by the first ground selection line GSL1 may be included in the $11^{th}$ cell string STR11. Likewise, the $12^{th}$ cell string STR12 may be connected with the second bit line BL2 and the common source line CSL, and the 1z-th cell string STR1z may be connected with the z-th bit line BLz and the common source line CSL.

The first to fourth word lines WL1 to WL4 and the sixth to eight word lines WL6 to WL8 may be unselected word lines uWL. The fifth word line WL5 may be the selected word line sWL. The first to fourth memory cells MC1 to MC4 and the sixth to eight memory cells MC6 to MC8 may be unselected memory cells uMC. The fifth memory cell MC5 may be a selected memory cell sMC.

Memory cells that are selected by one string selection line and are connected with one word line may constitute one page. For example, the fifth memory cells MC5 that is selected by the first string selection line SSL1 and is connected with the fifth word line WL5 may constitute one page. Eight pages may be implemented by using the memory cells connected with the fifth word line WL5. Among the eight pages, the page connected with the first string selection line SSL1 may be a selected page.

Figure 5:
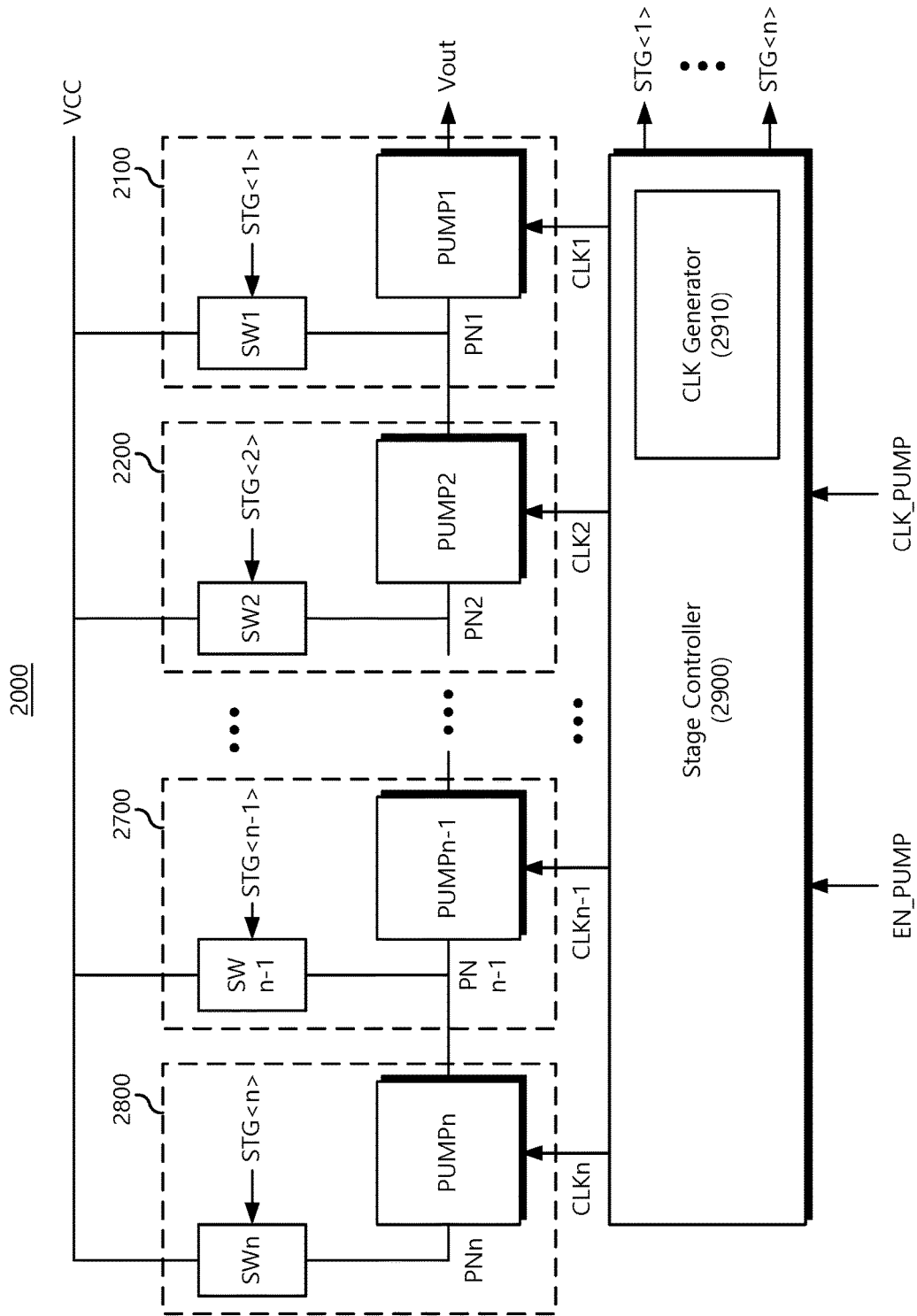
FIG. 5 is a block diagram illustrating a charge pump illustrated in FIG. 2.

FIG. 5 is a block diagram illustrating a charge pump illustrated in FIG. 2. Referring to FIG. 5, the charge pump 2000 includes first to eighth stage pumps 2100 to 2800 and a stage controller 2900. The stage controller 2900 includes a clock generator 2910. The first to eighth stage pumps 2100 to 2800 may generate the output voltage Vout in response to a stage signal and a clock signal from the stage controller 2900.

The charge pump 2000 may drive a pump stage sequentially in the order from the first stage pump 2100 to the n-th stage pump 2800. That is, first, the first stage pump 2100 may operate in response to a first clock signal CLK1. Next, the second stage pump 2200 may operate in response to a second clock signal CLK2. As in the above description, the (n−1)-th stage pump 2700 may operate in response to a (n−1)-th clock signal CLKn−1, and the n-th stage pump 2800 may operate in response to an n-th clock signal CLKn.

The charge pump 2000 may generate the output voltage Vout of a first level by using the first stage pump 2100. The first stage pump 2100 may include a first switch circuit SW1 and a first pump circuit PUMP1. The first switch circuit SW1 may provide the power supply voltage VCC to a first pump node PN1 in response to a first stage signal STG<1>. The first pump circuit PUMP1 may receive the first clock signal CLK1 and may generate the output voltage Vout by using a first pump node power.

The charge pump 2000 may generate the output voltage Vout of a second level by using the first and second stage pumps 2100 and 2200. A second switch circuit SW2 of the second stage pump 2200 may provide the power supply voltage VCC to a second pump node PN2 in response to a second stage signal STG<2>. The second pump circuit PUMP2 may receive the second clock signal CLK2 and may generate the first pump node power by using a second pump node power. The first stage pump 2100 may generate the output voltage Vout of the second level by using the first pump node power.

As in the above description, the charge pump 2000 may generate the output voltage Vout of an n-th level by using the first to n-th stage pumps 2100 to 2800. An n-th switch circuit SWn of the n-th stage pump 2800 may provide the power supply voltage VCC to an n-th pump node PNn in response to an n-th stage signal STG<n>. The n-th pump circuit PUMPn may receive the n-th clock signal CLKn and may generate a (n−1)-th pump node power by using an n-th pump node power.

The (n−1)-th stage pump 2700 may receive the (n−1)-th clock signal CLKn−1 and may generate a (n−2)-th pump node power by using the (n−1)-th pump node power. As in the above description, the second stage pump 2200 may generate the first pump node power by using the second pump node power. The first stage pump 2100 may generate the output voltage Vout of the n-th level by using the first pump node power.

The charge pump 2000 may not certainly start the driving operation from the first stage pump 2100; in some cases, the charge pump 2000 may start the driving operation from the second to (n−1)-th stage pumps. For example, the charge pump 2000 may start the driving operation from the fourth stage pump. In some embodiments, the charge pump 2000 may start driving operation from any one stage pump of the first to n-th stage pumps 2100 to 2800.

Figure 6:
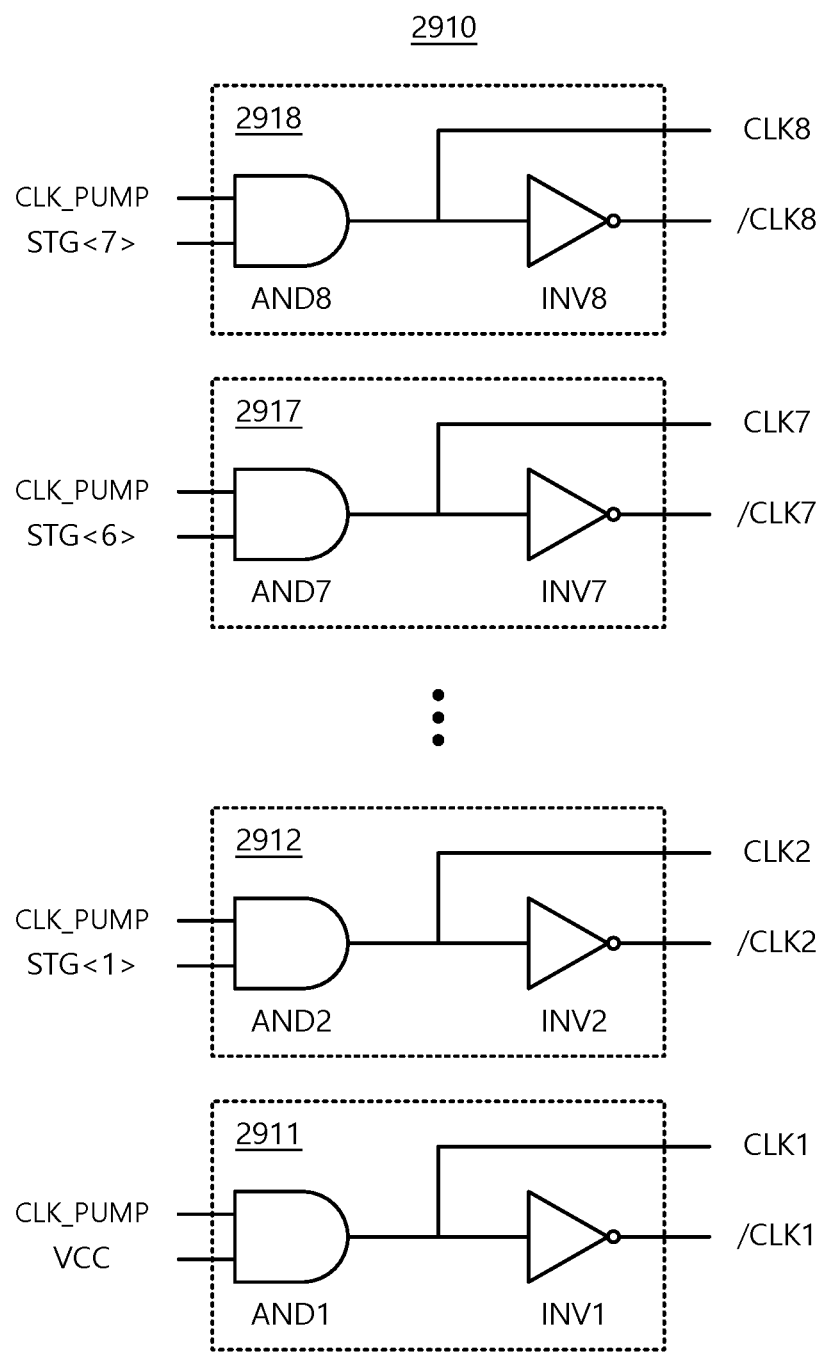
FIG. 6 is a circuit diagram illustrating a clock generator of a stage controller illustrated in FIG. 5.

FIG. 6 is a circuit diagram illustrating a clock generator of a stage controller illustrated in FIG. 5. Below, it is assumed that the charge pump 2000 illustrated in FIG. 5 includes first to eighth stage pumps. Referring to FIG. 6, the clock generator 2910 may include first to eighth clock generators 2911 to 2918. The clock generator 2910 may receive a clock pump signal CLK_PUMP and may generate first to eighth clock signals CLK1 to CLK8.

The first clock generator 2911 may include a first AND gate AND1 and a first inverter INV1. The first clock generator 2911 may receive the clock pump signal CLK_PUMP and the power supply voltage VCC and may generate the first clock signal CLK1 and a first complementary clock signal/CLK1. The second clock generator 2912 may include a second AND gate AND2 and a second inverter INV2. The second clock generator 2912 may receive the clock pump signal CLK_PUMP and the first stage signal STG<1> and may generate the second clock signal CLK2 and a second complementary clock signal/CLK2.

As in the above description, the seventh clock generator 2917 may include a seventh AND gate AND7 and a seventh inverter INV7 and may generate the seventh clock signal CLK7 and a seventh complementary clock signal/CLK7 in response to the clock pump signal CLK_PUMP and the sixth stage signal STG<6>. The eighth clock generator 2918 may include an eighth AND gate AND8 and an eighth inverter INV8 and may generate the eighth clock signal CLK8 and an eighth complementary clock signal/CLK8 in response to the clock pump signal CLK_PUMP and the seventh stage signal STG<7>.

Figure 7:
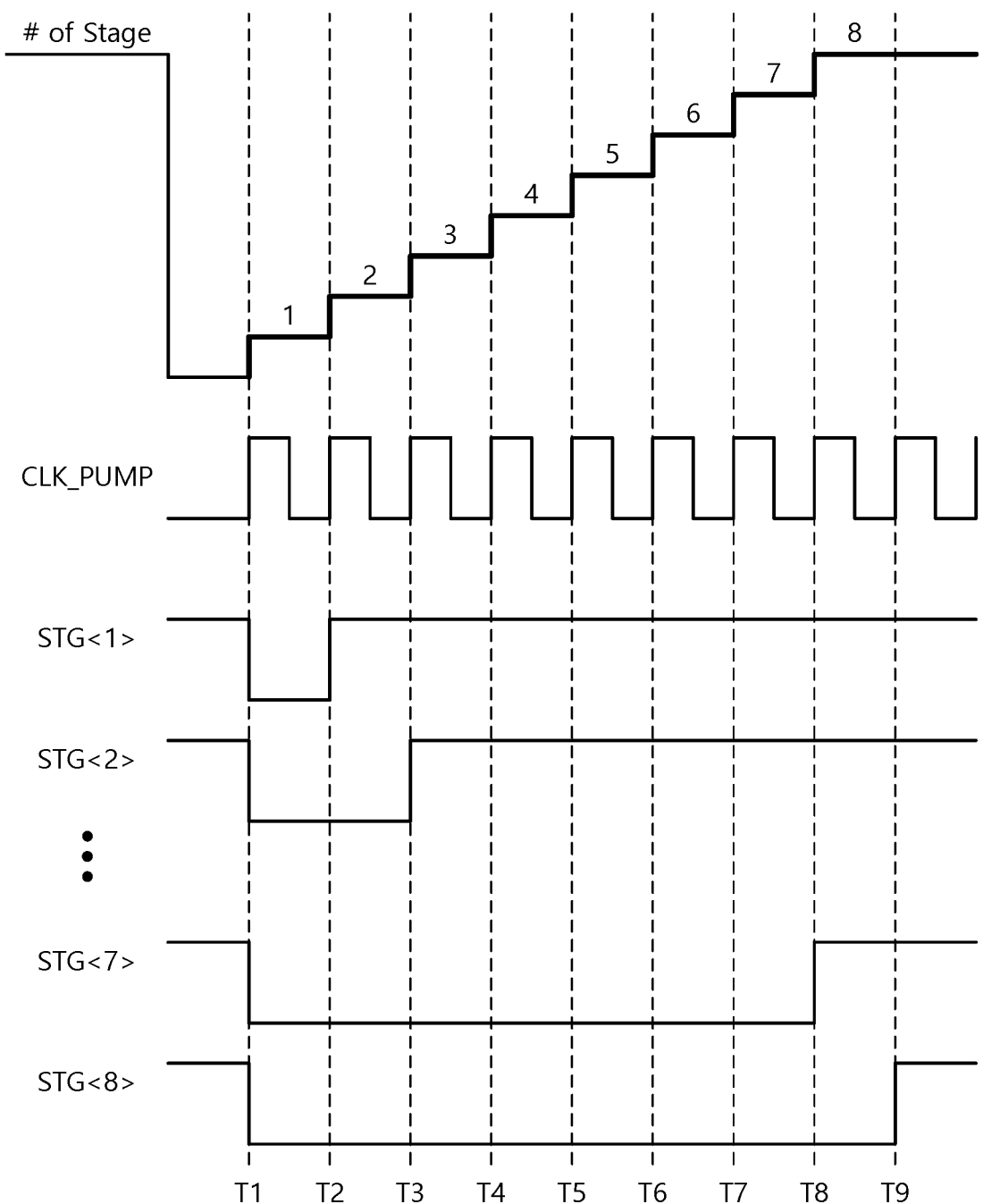
FIGS. 7 and 8 are timing diagrams illustrating an operating method of a pump circuit illustrated in FIG. 5.
Figure 8:
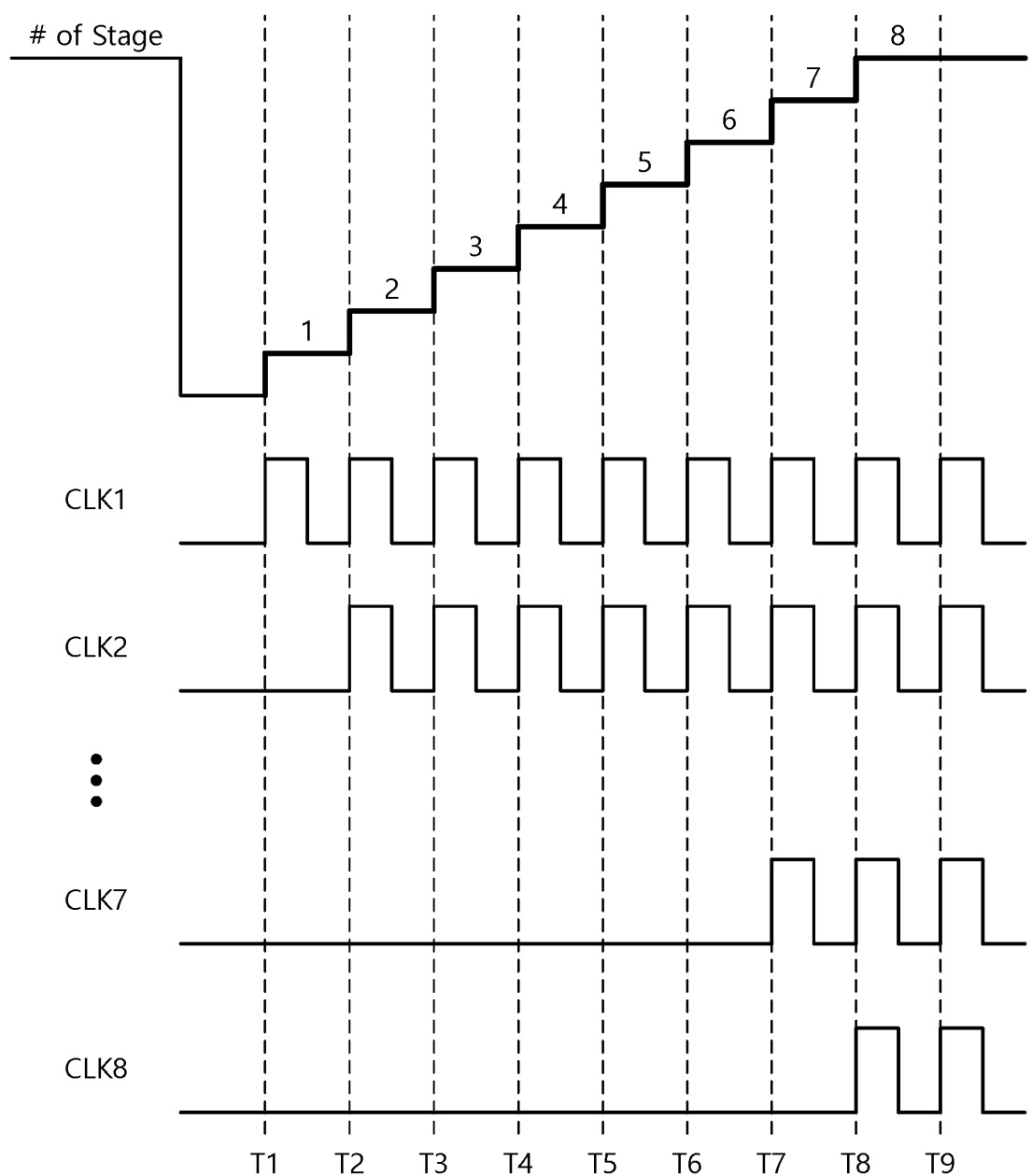

FIGS. 7 and 8 are timing diagrams illustrating an operating method of a pump circuit illustrated in FIG. 5. Referring to FIGS. 7 and 8, the first to eighth stage signals STG<1> to STG<8> transition from a high level to a low level at T1. Afterwards, the first to eighth stage signals STG<1> to STG<8> sequentially transition to the high level from T2 to T9.

The first clock signal CLK1 may be output as a result of performing the AND operation on the power supply voltage VCC and the clock pump signal CLK_PUMP. In a time period from T1 to T2, the first stage pump 2100 may generate the output voltage Vout of the first level by performing the pumping operation in response to the first stage signal STG<1> and the first clock signal CLK1.

The second clock signal CLK2 may be output as a result of performing the AND operation on the first stage signal STG<1> and the clock pump signal CLK_PUMP. In a time period from T2 to T3, the second stage pump 2200 may perform the pumping operation in response to the second stage signal STG<2> and the second clock signal CLK2. The first stage pump 2100 may receive the second pump node power and may generate the output voltage Vout of the second level.

As in the above description, the eighth clock signal CLK8 may be output as a result of performing the AND operation on the seventh stage signal STG<7> and the clock pump signal CLK_PUMP. In a time period from T8 to T9, the eighth stage pump 2800 may perform the pumping operation in response to the eighth stage signal STG<8> and the eighth clock signal CLK8. The first stage pump 2100 may receive the pumping result of the second to eighth stage pumps 2200 to 2800 and may generate the output voltage Vout of an eighth level.

Figure 9:
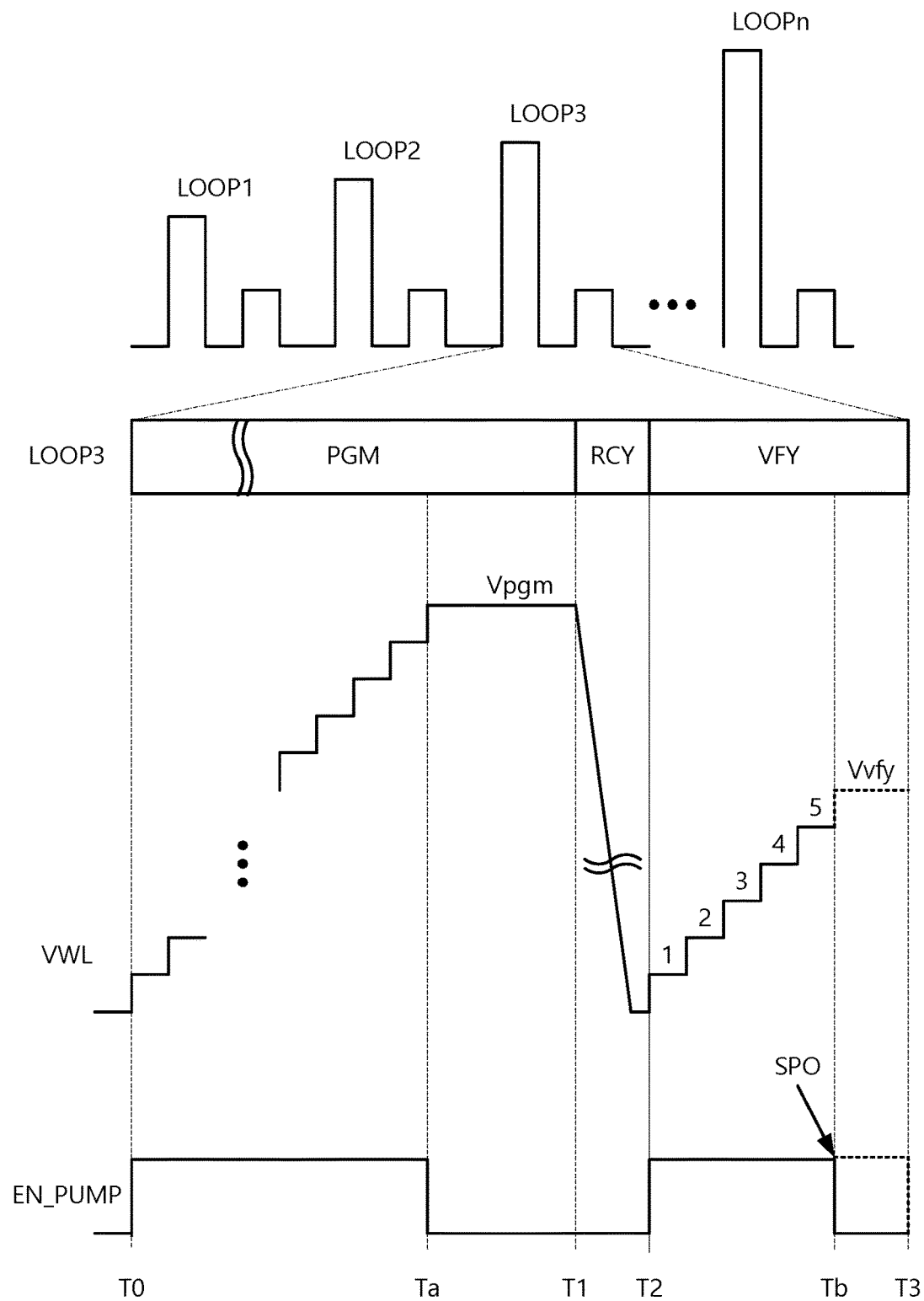
FIG. 9 is a timing diagram illustrating an example in which a sudden power-off event occurs while a program verify voltage is generated in a program loop period of a flash memory illustrated in FIG. 2.

FIG. 9 is a timing diagram illustrating an example in which a sudden power-off event occurs while a program verify voltage is generated in a program loop period of a flash memory illustrated in FIG. 2. To control threshold voltage distributions of memory cells accurately, the flash memory 1100 may perform the program operation in the incremental step pulse programming (ISPP) manner.

The flash memory 1100 may program a selected memory cell to a target program state through a plurality of program loops LOOP1 to LOOPn. One program loop (e.g., LOOP3) may include a program operation PGM, a recovery operation RCY, and a verify operation VFY.

In a time period from T0 to T1, the flash memory 1100 may perform the program operation PGM. The flash memory 1100 may provide the program voltage Vpgm to the selected word line sWL. The program voltage Vpgm may be generated by using the charge pump 2000. The charge pump 2000 may use a plurality of stage pumps for the purpose of generating the program voltage Vpgm of a high voltage. In a time period from T0 to Ta, the pump enable signal EN_PUMP may be activated, and the charge pump 2000 may operate to generate the program voltage VPGM.

In a time period from T1 to T2, the flash memory 1100 may perform the recovery operation RCY. The recovery operation RCY may be included between the program operation PGM and the verify operation VFY. The recovery operation RCY may refer to an operation of discharging a voltage applied to a word line after a selected memory cell is programmed. That is, the recovery operation RCY may refer to a preparation operation that allows the flash memory 1100 to perform any other operation.

In a time period from T2 to T3, the flash memory 1100 may perform the verify operation VFY. After voltages applied to word lines are completely discharged, during the verify operation VFY, the charge pump 2000 may generate a program verify voltage Vvfy by using the power supply voltage VCC. The charge pump 2000 may generate the program verify voltage Vvfy by using stage pumps, the number of which corresponds to a count value (# of Stage).

For example, the count value may mean the number of stage pumps that will perform the pumping operation. Alternatively, the count value may indicate a stage pump, which starts the pumping operation, from among the plurality of stage pumps. In an example of FIG. 9, the count value may be "5", and a stage pump that starts the pumping operation may be the fifth stage pump 2500. The charge pump 2000 may generate the program verify voltage Vvfy by using the first to fifth stage pumps 2100 to 2500.

At a time Tb, a sudden power-off event may occur in the flash memory 1100. Immediately before the time Tb, the output terminal of the first stage pump 2100 has the output voltage Vout of the fifth level. When the sudden power-off event occurs at the time Tb, a great voltage difference may exist between the input terminal and the output terminal of the first stage pump 2100. The great voltage difference may cause the breakdown of transistors or diodes present in the first stage pump 2100.

The breakdown may occur when a voltage difference between a drain and a source of a transistor or an input terminal and an output terminal of a diode is greater than a breakdown voltage thereof. In the sudden power-off event, the breakdown may occur to the first stage pump 2100; however, the breakdown may occur to any one of the second to fifth stage pumps 2200 to 2500.

Figure 10:
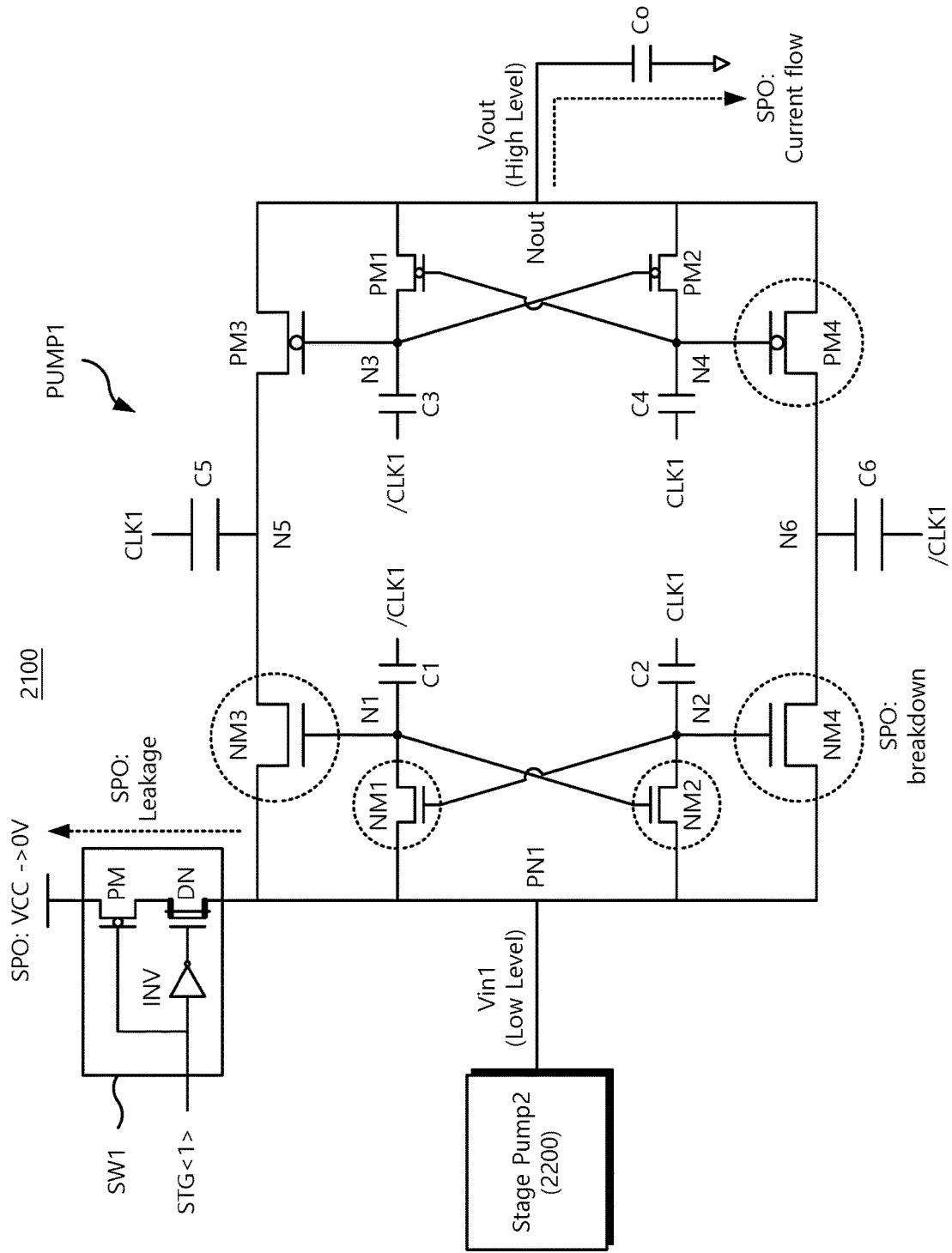
FIGS. 10 to 12 are circuit diagrams illustrating a first stage pump illustrated in FIG. 5.
Figure 11:
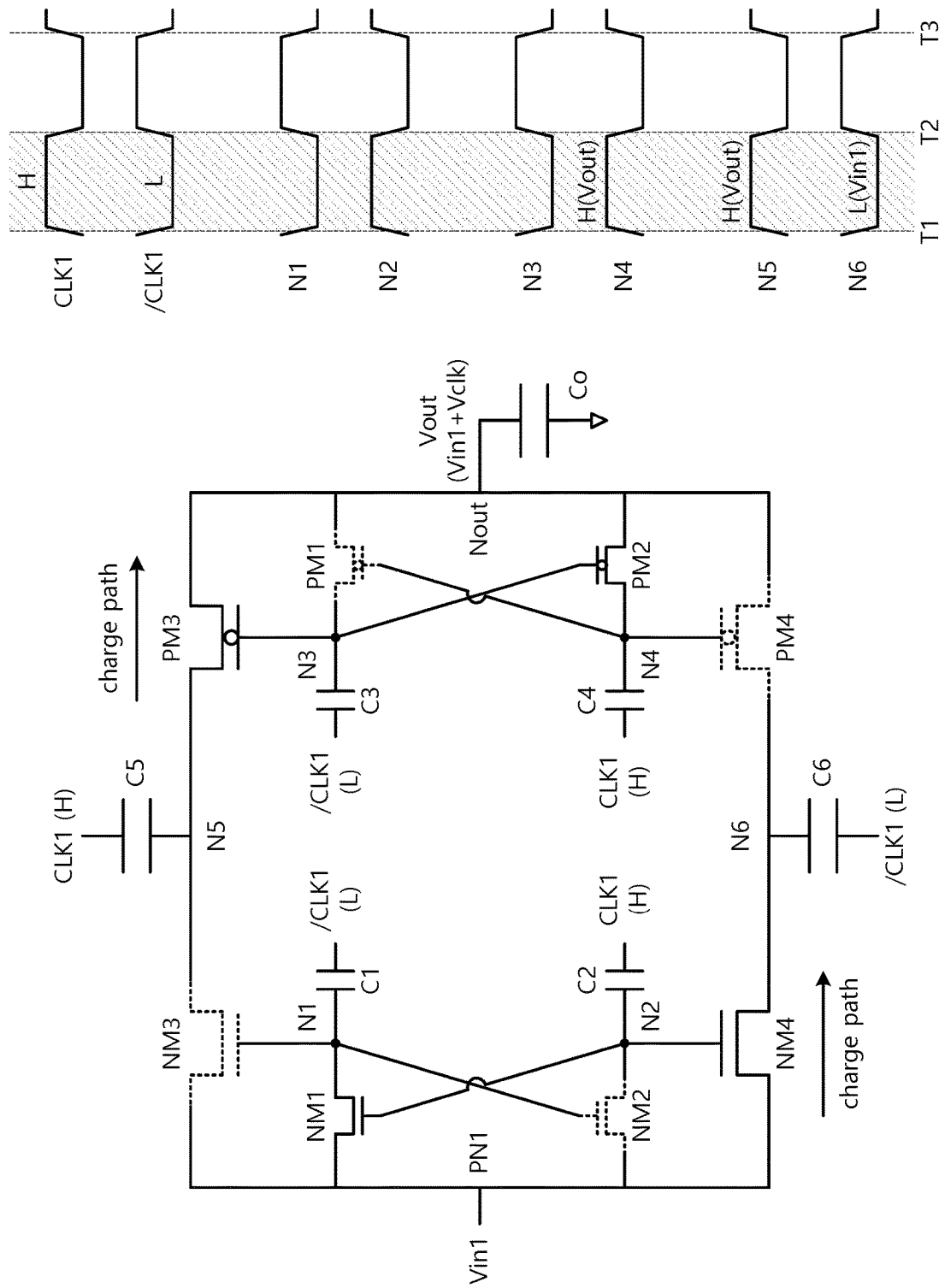
Figure 12:
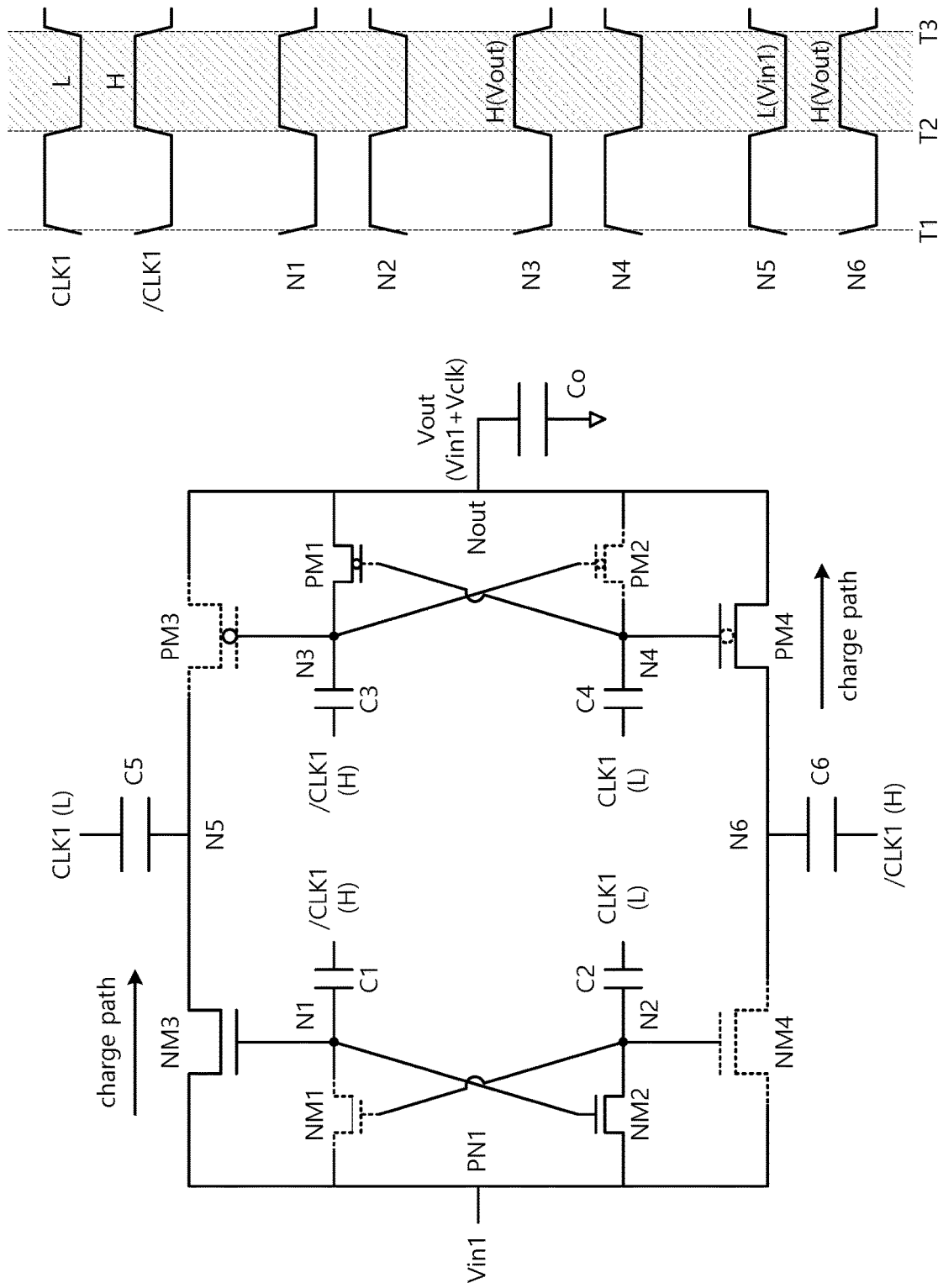

FIGS. 10 to 12 are circuit diagrams illustrating a first stage pump illustrated in FIG. 5. FIG. 10 shows a current flow and a breakdown phenomenon occurring in the first stage pump 2100 when the sudden power-off event occurs. Referring to FIG. 10, the first stage pump 2100 may include the first switch circuit SW1 and the first pump circuit PUMP1.

The first switch circuit SW1 may include a PMOS transistor PM and a depletion NMOS transistor DN connected in series between a power terminal and the pump node PN1. An inverter INV may be connected with a gate of the depletion NMOS transistor DN. The first stage signal STG<1> may be input to a gate of the PMOS transistor PM and an input terminal of the inverter INV. When the first stage signal STG<1> is at the low level, the power supply voltage VCC may be provided to the first pump circuit PUMP1 through the first switch circuit SW1.

The first pump circuit PUMP1 may include a plurality of transistors and a plurality of capacitors. A first NMOS transistor NM1 may be connected between the pump node PN1 of the first pump circuit PUMP1 and a first node N1. A second NMOS transistor NM2 may be connected between the pump node PN1 and a second node N2. A first capacitor C1 may be connected with the first node N1, and the first complementary clock signal /CLK1 may be input thereto. For example, the first complementary clock signal /CLK1 may be input to the first node N1 via the first capacitor C1. A second capacitor C2 may be connected with the second node N2, and the first clock signal CLK1 may be input thereto. For example, the first clock signal CLK1 may be input to the second node N2 via the second capacitor C2. A gate of the first NMOS transistor NM1 may be connected with the second node N2, and a gate of the second NMOS transistor NM2 may be connected with the first node N1.

A first PMOS transistor PM1 may be connected between an output terminal Nout of the first pump circuit PUMP1 and a third node N3. A second PMOS transistor PM2 may be connected between the output terminal Nout and a fourth node N4. A third capacitor C3 may be connected with the third node N3, and the first complementary clock signal /CLK1 may be input thereto. For example, the first complementary clock signal /CLK1 may be input to the third node N2 via the third capacitor C3. A fourth capacitor C4 may be connected with the fourth node N4, and the first clock signal CLK1 may be input thereto. For example, the first clock signal CLK1 may be input to the fourth node N4 via the fourth capacitor C4. A gate of the first PMOS transistor PM1 may be connected with the fourth node N4, and a gate of the second PMOS transistor PM2 may be connected with the third node N3.

A third NMOS transistor NM3 may be connected between the pump node PN1 of the first pump circuit PUMP1 and a fifth node N5. A fourth NMOS transistor NM4 may be connected between the pump node PN1 and a sixth node N6. A fifth capacitor C5 may be connected with the fifth node N5, and the first clock signal CLK1 may be input thereto. For example, the first clock signal CLK1 may be input to the fifth node N5 via the fifth capacitor C5. A sixth capacitor C6 may be connected with the sixth node N6, and the first complementary clock signal /CLK1 may be input thereto. For example, the first complementary clock signal /CLK1 may be input to the sixth node N6 via the sixth capacitor C6. A gate of the third NMOS transistor NM3 may be connected with the first node N1, and a gate of the fourth NMOS transistor NM4 may be connected with the second node N2.

A third PMOS transistor PM3 may be connected between the output terminal Nout of the first pump circuit PUMP1 and the fifth node N5. A fourth PMOS transistor PM4 may be connected between the output terminal Nout and the sixth node N6. A gate of the third PMOS transistor PM3 may be connected with the third node N3, and a gate of the fourth PMOS transistor PM4 may be connected with the fourth node N4.

Referring to FIG. 11, when the first clock signal CLK1 of the high level and the first complementary clock signal /CLK1 of the low level are received, the first NMOS transistor NM1 and the fourth NMOS transistor NM4 are turned on, and the second NMOS transistor NM2 and the third NMOS transistor NM3 are turned off. Also, the first PMOS transistor PM1 and the fourth PMOS transistor PM4 are turned off, and the second PMOS transistor PM2 and the third PMOS transistor PM3 are turned on.

A charge path of the first pump circuit PUMP1 may be formed through the fourth NMOS transistor NM4 and the third PMOS transistor PM3. Charges of the pump node PN1 may be transferred to the sixth node N6 through the fourth NMOS transistor NM4. In this case, a voltage level of the sixth node N6 may be "L" (Vin1). Charges of the fifth node N5 may be transferred to the output terminal Nout through the third PMOS transistor PM3, and the output terminal Nout may increase. Also, the charge sharing may occur among the fourth capacitor C4, the fifth capacitor C5, and an output capacitor Co. In this case, voltage levels of the fourth node N4 and the fifth node N5 may be "H" (Vout).

Referring to FIG. 12, when the first clock signal CLK1 of the low level and the first complementary clock signal /CLK1 of the high level are received, the first NMOS transistor NM1 and the fourth NMOS transistor NM4 are turned off, and the second NMOS transistor NM2 and the third NMOS transistor NM3 are turned on. Also, the first PMOS transistor PM1 and the fourth PMOS transistor PM4 are turned on, and the second PMOS transistor PM2 and the third PMOS transistor PM3 are turned off.

A charge path of the first pump circuit PUMP1 may be formed through the third NMOS transistor NM3 and the fourth PMOS transistor PM4. Charges of the pump node PN1 may be transferred to the fifth node N5 through the third NMOS transistor NM3. In this case, a voltage level of the fifth node N5 may be "L" (Vin1). Charges of the sixth node N6 may be transferred to the output terminal Nout through the fourth PMOS transistor PM4, and the output terminal Nout may increase. Also, the charge sharing may occur among the third capacitor C3, the sixth capacitor C6, and the output capacitor Co. In this case, voltage levels of the third node N3 and the sixth node N6 may be "H" (Vout).

Returning to FIG. 10, the first stage pump 2100 illustrated in FIG. 10 may generate the output voltage Vout in the manner illustrated in FIGS. 11 and 12. The output voltage Vout may correspond to "Vin1+Vclk". Herein, Vin1 may be a first pump node voltage, and Vclk may be a voltage increased by the first pump circuit PUMP1.

During the verify operation VFY (refer to FIG. 9), the output voltage Vout of the first stage pump 2100 may increase to a high level of a fifth level. The sudden power-off event may occur at the time Tb of FIG. 9. When the sudden power-off event occurs, a great voltage difference may exist between the pump node PN1 and the output terminal Nout of the first stage pump 2100 or between nodes thereof. When charges of each node are not discharged quickly in the sudden power-off event, elements of the first stage pump 2100 may experience the breakdown due to the great voltage difference.

For example, the breakdown may occur to the first NMOS transistor NM1 due to a voltage difference between the first node N1 and the pump node PN1. Likewise, the breakdown may occur to the second to fourth NMOS transistors NM2, NM3, and NM4. Also, the breakdown may occur to the fourth PMOS transistor PM4 due to a voltage difference between the output terminal Nout and the sixth node N6.

In addition, an unintended current flow of charged charges may occur at the pump node PN1 and the output terminal Nout of the first stage pump 2100. For example, a leakage current may flow from the pump node PN1 of the first pump circuit PUMP1 to the power terminal through the first switch circuit SW1. An unintended leakage path may be formed through the depletion NMOS transistor DN and the PMOS transistor PM of the first switch circuit SW1.

The flash memory 1100 according to an embodiment of the present disclosure may improve reliability of an internal circuit by blocking a leakage current through a switch circuit of the charge pump 2000. Also, according to the present disclosure, the breakdown of internal elements may be prevented by quickly discharging the charged charges of each node through a discharge path in the sudden power-off event. Below, a stage pump that forms a discharge path in the sudden power-off event will be described.

Figure 13:
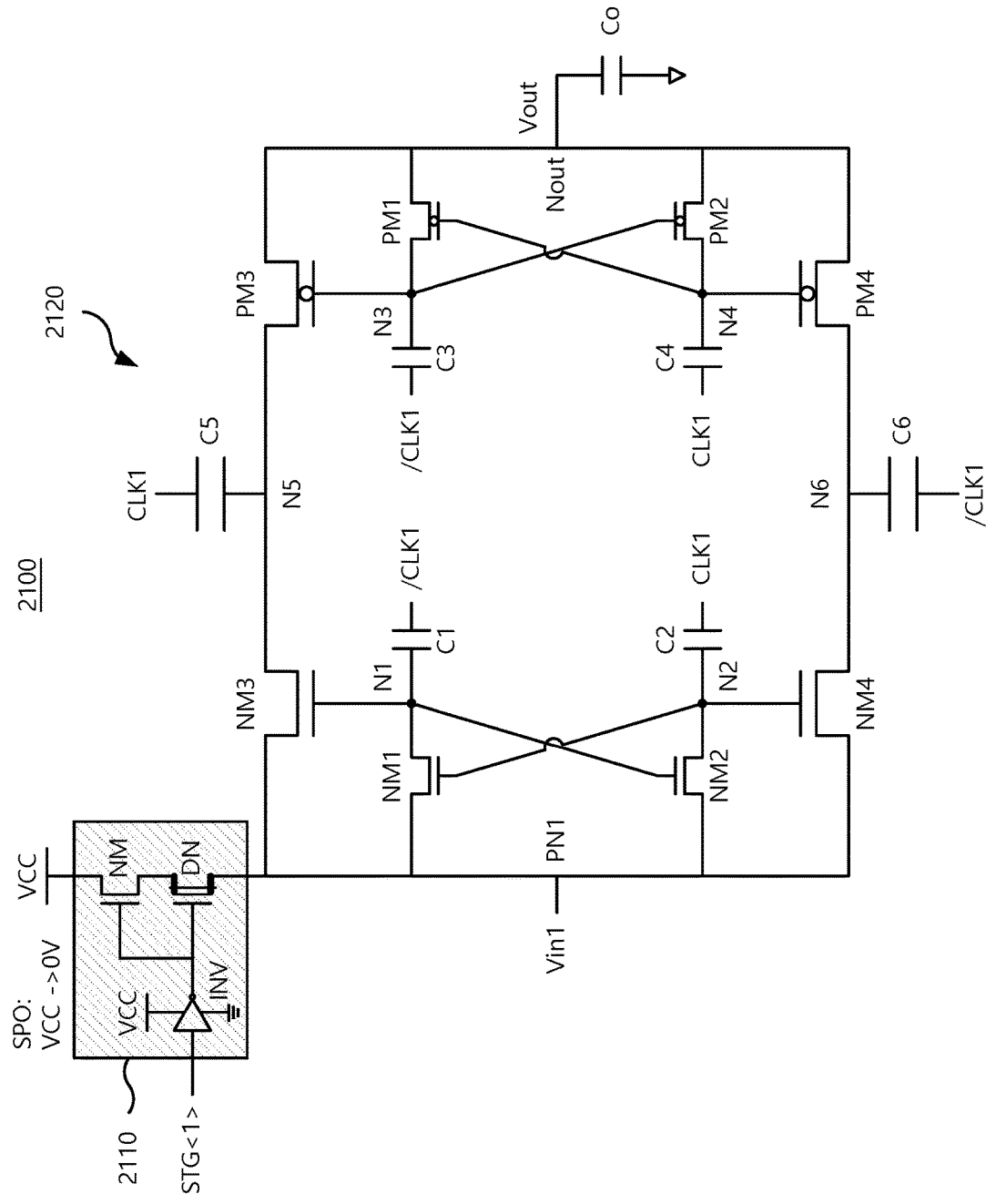
FIG. 13 is a circuit diagram illustrating an example of a first stage pump illustrated in FIG. 5.

FIG. 13 is a circuit diagram illustrating another example of a first stage pump illustrated in FIG. 5. Referring to FIG. 13, the first stage pump 2100 may include a first switch circuit 2110 and a first pump circuit 2120. An internal configuration and an operation principle of the first pump circuit 2120 are identical to those described with reference to FIGS. 10 to 12.

In the normal operation, the first switch circuit 2110 may provide the power supply voltage VCC to the first pump circuit 2120 in response to the first stage signal STG<1>. In the normal operation or the sudden power-off event, the first switch circuit 2110 may block a leakage current from the pump node PN1 to the power terminal. The first switch circuit 2110 may improve the reliability of the first pump circuit 2120 by blocking an unintended leakage current.

The first switch circuit 2110 may include an NMOS transistor NM (i.e., an enhancement-type NMOS transistor) and a depletion NMOS transistor DN connected in series between the power terminal and the pump node PN1. The depletion NMOS transistor DN may be implemented with a high-voltage transistor having endurance against a higher voltage than a power supply voltage. An inverter INV may be connected with gates of the NMOS transistor NM and the depletion NMOS transistor DN. The inverter INV may operate based on the power supply voltage VCC supplied from the power terminal. The first stage signal STG<1> may be input to an input terminal of the inverter INV. When the first stage signal STG<1> is at the low level, the power supply voltage VCC may be provided to the gates of the NMOS transistor NM and the depletion NMOS transistor DN. For example, the inverter INV may be connected between the power terminal of the power supply voltage VCC and a ground terminal. In this case, as the gate and the source of the NMOS transistor NM are connected with the power supply voltage VCC, the NMOS transistor NM may be diode-connected. For example, in the normal operation, the power supply voltage VCC may be supplied to the inverter INV.

When the sudden power-off event occurs, the first switch circuit 2110 may basically block a current flow or a leakage current from the pump node PN1 of the first switch circuit 2110 to the power terminal. For example, when the sudden power-off event occurs, the power terminal may not have the power supply voltage VCC. According to the present disclosure, through the above structure, internal elements of the charge pump 2000 may be prevented, and the output voltage Vout may be stably generated. That is, the reliability of data may be improved. In some embodiments, the inverter INV may serve as a detector of the sudden power-off event. For example, in the normal operation in which the power supply voltage VCC is supplied to the first switch circuit 2110, the first stage signal STG<1> may be delivered to the gate of the NMOS transistor NM and the gate of the depletion NMOS transistor DN via the inverter INV. When the sudden power-off event occurs, the power supply voltage VCC may sharply change to a ground voltage and thus the inverter INV does not properly operate. The first stage signal STG<1> may not be delivered to the gate of the NMOS transistor NM and the depletion NMOS transistor DN via the inverter INV.

Figure 14:
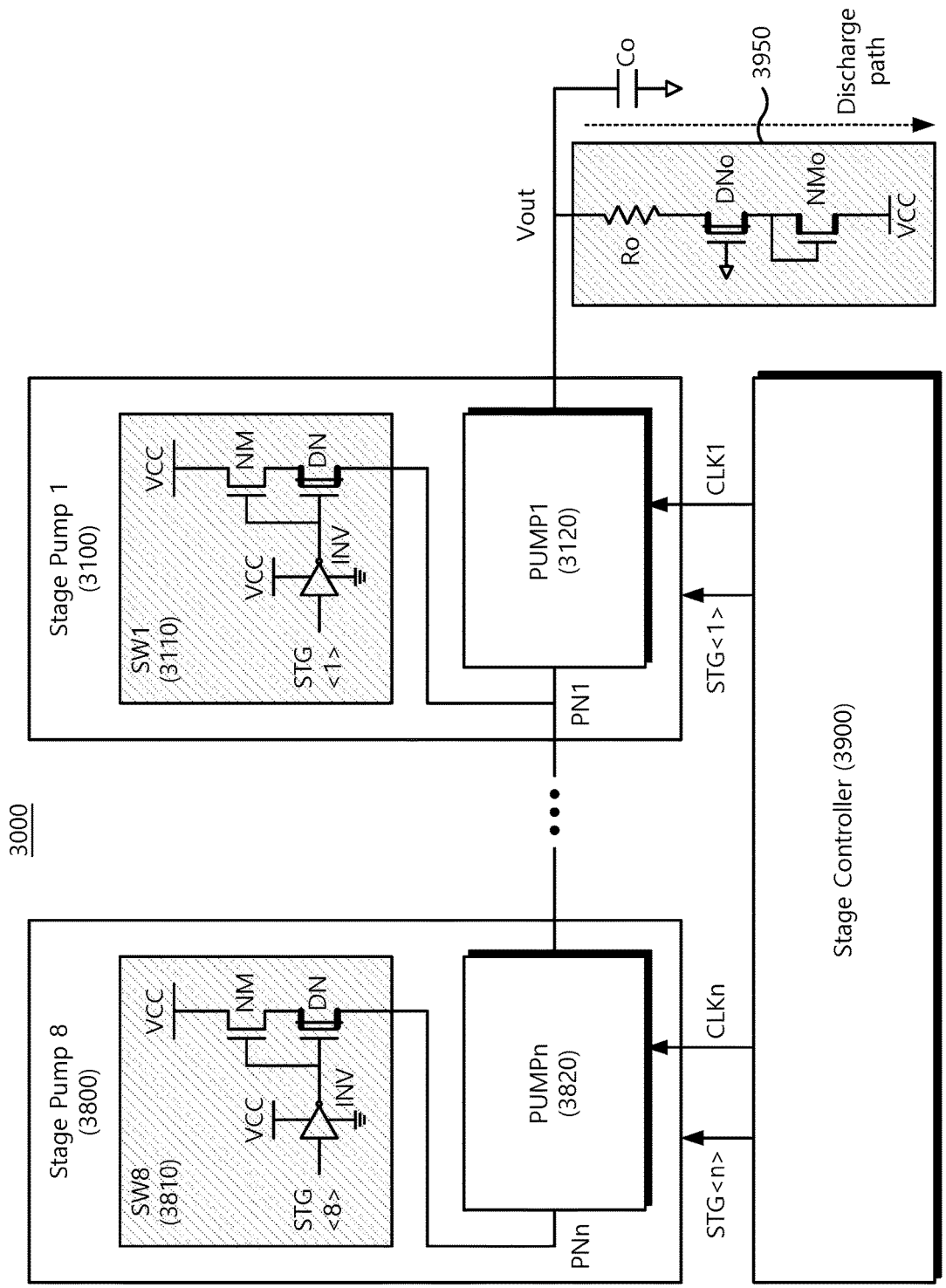
FIG. 14 is a block diagram illustrating an embodiment of a charge pump illustrated in FIG. 2.

FIG. 14 is a block diagram illustrating another embodiment of a charge pump illustrated in FIG. 2. Referring to FIG. 14, a charge pump 3000 includes first to eighth stage pumps 3100 to 3800, a stage controller 3900, and a discharge circuit 3950. The first to eighth stage pumps 3100 to 3800 may generate the output voltage Vout in response to a stage signal and a clock signal from the stage controller 3900.

The charge pump 3000 may drive a pump stage sequentially in the order from the first stage pump 3100 to the eighth stage pump 3800. That is, first, the first stage pump 3100 may operate in response to the first clock signal CLK1. Next, the second stage pump 3200 may operate in response to the second clock signal CLK2. As in the above description, the eighth stage pump 3800 may operate in response to the eighth clock signal CLK8.

The first stage pump 3100 may include a first switch circuit (SW1) 3110 and a first pump circuit (PUMP1) 3120. Likewise, the eighth stage pump 3800 may include an eighth switch circuit (SW8) 3810 and an eighth pump circuit (PUMPS) 3820. The first to eighth stage pumps 3100 to 3800 have the same internal configuration and the same operation principle.

In the normal operation, the first switch circuit 3110 may provide the power supply voltage VCC to the first pump node PN1 in response to the first stage signal STG<1>. In the sudden power-off event, the first switch circuit 3110 may prevent a leakage current from flowing from the pump node PN1 to the power terminal. Likewise, in the sudden power-off event, the eighth switch circuit 3810 may prevent a leakage current from flowing from the pump node PN8 to the power terminal. The first to eighth switch circuits 3110 to 3810 may remove an unintended leakage path in the sudden power-off event.

The discharge circuit 3950 may be connected between an output terminal and the power terminal. The discharge circuit 3950 may quickly discharge charges of the output terminal in the sudden power-off event. As the discharge circuit 3950 quickly discharges charges of the output terminal in the sudden power-off event, the breakdown of elements in the first pump circuit 3120 may be prevented, and an unintended leakage path may be removed.

The discharge circuit 3950 may include a resistor Ro, a depletion NMOS transistor Dno, and an NMOS transistor Nmo connected in series between the output terminal and the power terminal. A ground terminal may be connected with a gate of the depletion NMOS transistor Dno. The NMOS transistor Nmo may be diode-connected, that is, a gate and a source of the NMOS transistor Nmo may be connected with each other. The depletion NMOS transistor Dno and the NMOS transistor Nmo may be high-voltage transistors having endurance against a high voltage.

When the sudden power-off event occurs, the discharge circuit 3950 may form a discharge path capable of quickly discharging charges charged at the output terminal to the power terminal. As such, in the sudden power-off event, the power supply voltage VCC may sharply decrease to 0 V. In this case, the charges of the output terminal may be quickly discharged through the discharge circuit 3950. The flash memory 1100 according to an embodiment of the present disclosure may protect internal elements of the charge pump 3000 from the breakdown or leakage in the sudden power-off event.

Figure 15:
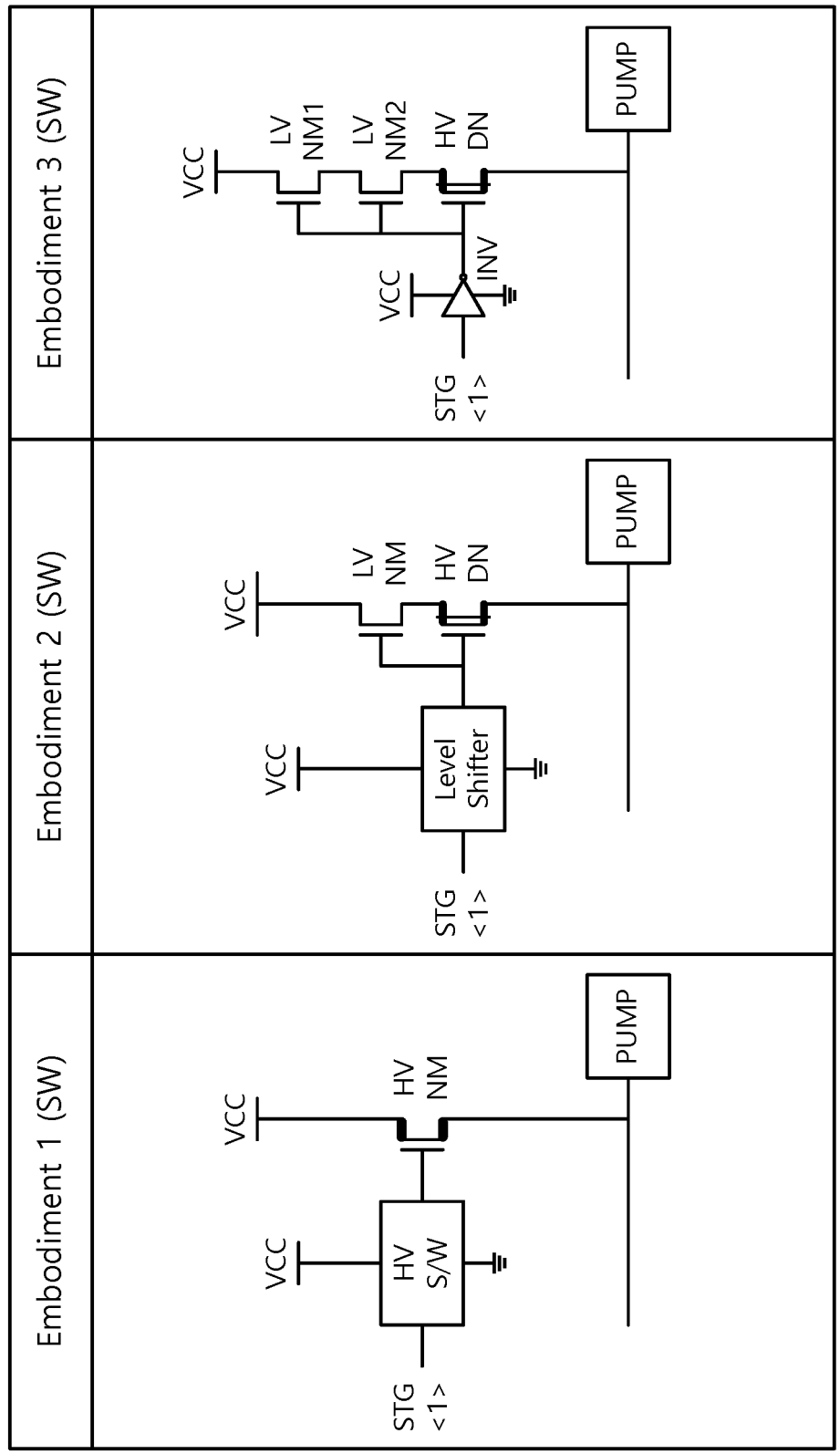
FIG. 15 is a block diagram illustrating various embodiments of a switching circuit illustrated in FIG. 14.

FIG. 15 is a block diagram illustrating various embodiments of a switching circuit illustrated in FIG. 14. A switch circuit of a stage pump according to an embodiment of the present disclosure may provide a power supply voltage to a pump circuit in the normal operation and may block a leakage current in the sudden power-off event.

Referring to the first embodiment of FIG. 15, the switch circuit SW may be implemented with a high-voltage NMOS transistor HV NM and a high-voltage switch HV S/W. The high-voltage NMOS transistor HV NM may be connected between the power terminal and the pump circuit PUMP. The high-voltage switch HV S/W may be connected with a gate of the high-voltage NMOS transistor HV NM. The high-voltage switch HV S/W may receive the power supply voltage VCC and may control the high-voltage NMOS transistor HV NM in response to the stage signal STG<1>.

Referring to the second embodiment of FIG. 15, the switch circuit SW may use a level shifter instead of the inverter INV of FIG. 14. The switch circuit SW may include a low-voltage NMOS transistor LV NM and a high-voltage depletion NMOS transistor HV DN connected in series between the power terminal and the pump circuit. The level shifter may be connected with a gate of the high-voltage depletion NMOS transistor HV DN. The level shifter may receive the power supply voltage VCC and may control the low-voltage NMOS transistor LV NM and the high-voltage depletion NMOS transistor HV DN.

Referring to the third embodiment of FIG. 15, the switch circuit SW may include a first low-voltage NMOS transistor LV NM1, a second low-voltage NMOS transistor LV NM2, and a high-voltage depletion NMOS transistor HV DN connected in series between the power terminal and the pump node. In the switch circuit SW, a stack structure in which more low-voltage NMOS transistors are included may be connected between the power terminal and the high-voltage depletion NMOS transistor HV DN.

An inverter INV may be connected with gates of the first and second low-voltage NMOS transistors LV NM1 and LV NM2 and the high-voltage depletion NMOS transistor HV DN. The inverter INV may receive the power supply voltage VCC and may control the first and second low-voltage NMOS transistors LV NM1 and LV NM2 and the high-voltage depletion NMOS transistor HV DN in response to the first stage signal STG<1>. In this case, a gate and a source of the first low-voltage NMOS transistor LV NM1 are connected with the power supply voltage VCC, that is, the first low-voltage NMOS transistor LV NM1 may be diode-connected. Meanwhile, the switch circuit SW may use a PMOS transistor instead of the second low-voltage NMOS transistor LV NM2.

Figure 16:
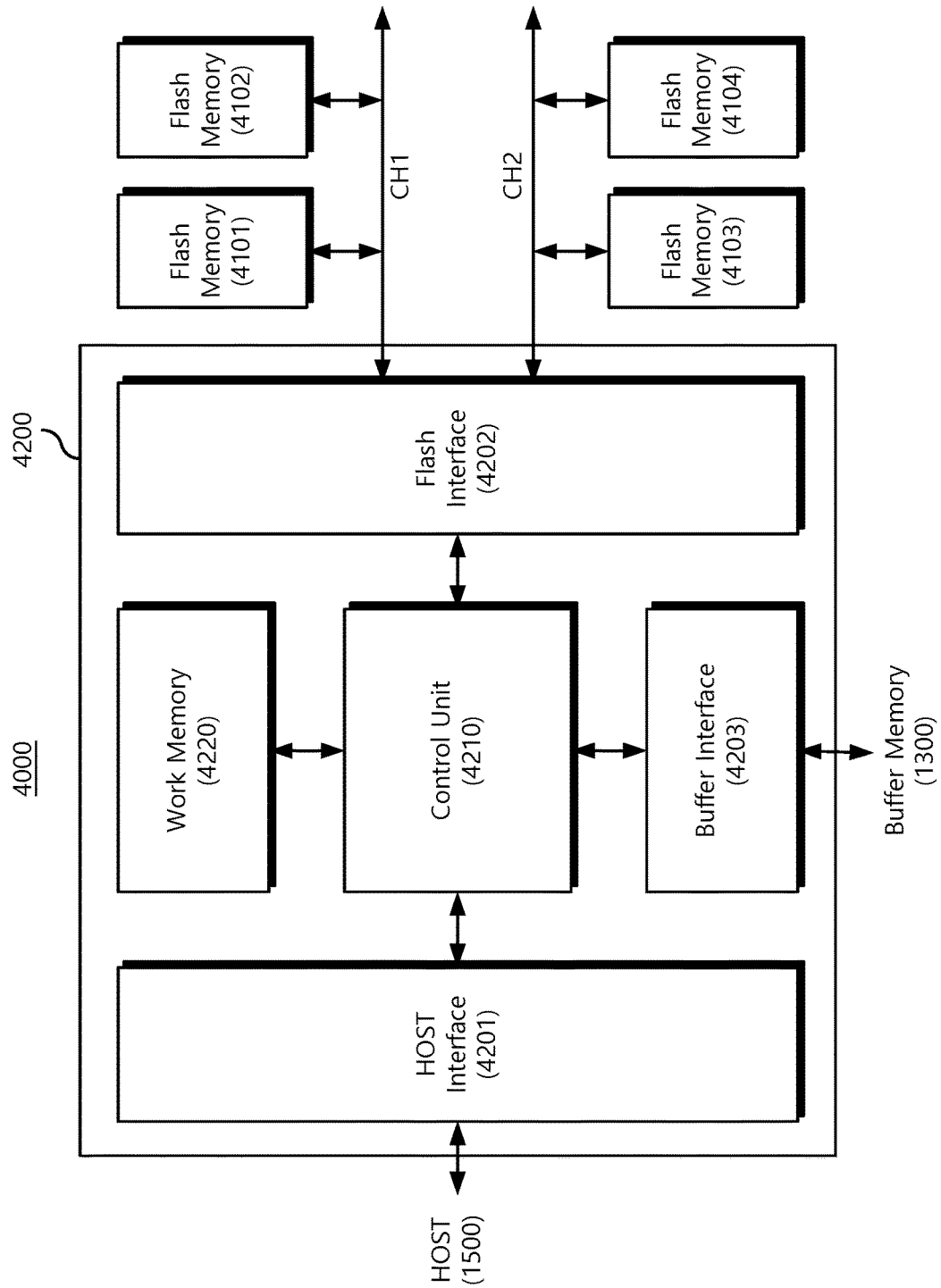
FIG. 16 is a block diagram illustrating an example in which a storage device according to an embodiment of the present disclosure is implemented with a solid state drive (SSD).

FIG. 16 is a block diagram illustrating an example in which a storage device according to an embodiment of the present disclosure is implemented with a solid state drive (SSD). Referring to FIG. 16, an SSD 4000 may include a plurality of flash memories 4101 to 4104 and an SSD controller 4200. The flash memories 4101 to 4104 illustrated in FIG. 16 may have the same internal configuration and operation principle as the flash memory described above.

The first and second flash memories 4101 and 4102 may be connected with the SSD controller 4200 through a first channel CH1. The third and fourth flash memories 4103 and 4104 may be connected with the SSD controller 4200 through a second channel CH2. The number of channels connected with the SSD controller 4200 may be 2 or more. The number of flash memories connected with one channel may be 2 or more.

The SSD controller 4200 may include a host interface 4201, a flash interface 4202, a buffer interface 4203, a control unit 4210, and a work memory 4220. The SSD controller 4200 may be connected with a host 1500 through the host interface 4201. Depending on a request of the host 1500, the SSD controller 4200 may write data in the corresponding flash memory or may read data from the corresponding flash memory.

The SSD controller 4200 may be connected with the plurality of flash memories 4101 to 4104 through the flash interface 4202 and may be connected with a buffer memory 1300 through the buffer interface 4203. The flash interface 4202 may provide data, which are temporarily stored in the buffer memory 1300, to the flash memories through the channels CH1 and CH2. The flash interface 4202 may transfer the data read from the flash memories 4101 to 4104 to the buffer memory 1300.

The control unit 4210 may analyze and process the signal received from the host 1500. The control unit 4210 may control the host 1500 or the flash memories 4101 to 4104 through the host interface 4201 or the flash interface 4202. The control unit 4210 may control operations of the flash memories 4101 to 4104 by using firmware for driving the SSD 4000.

The SSD controller 4200 may manage data to be stored in the flash memories 4101 to 4104. In the sudden power-off event, the SSD controller 4200 may back the data stored in the work memory 4220 or the buffer memory 1300 up to the flash memories 4101 to 4104.

Figure 17:
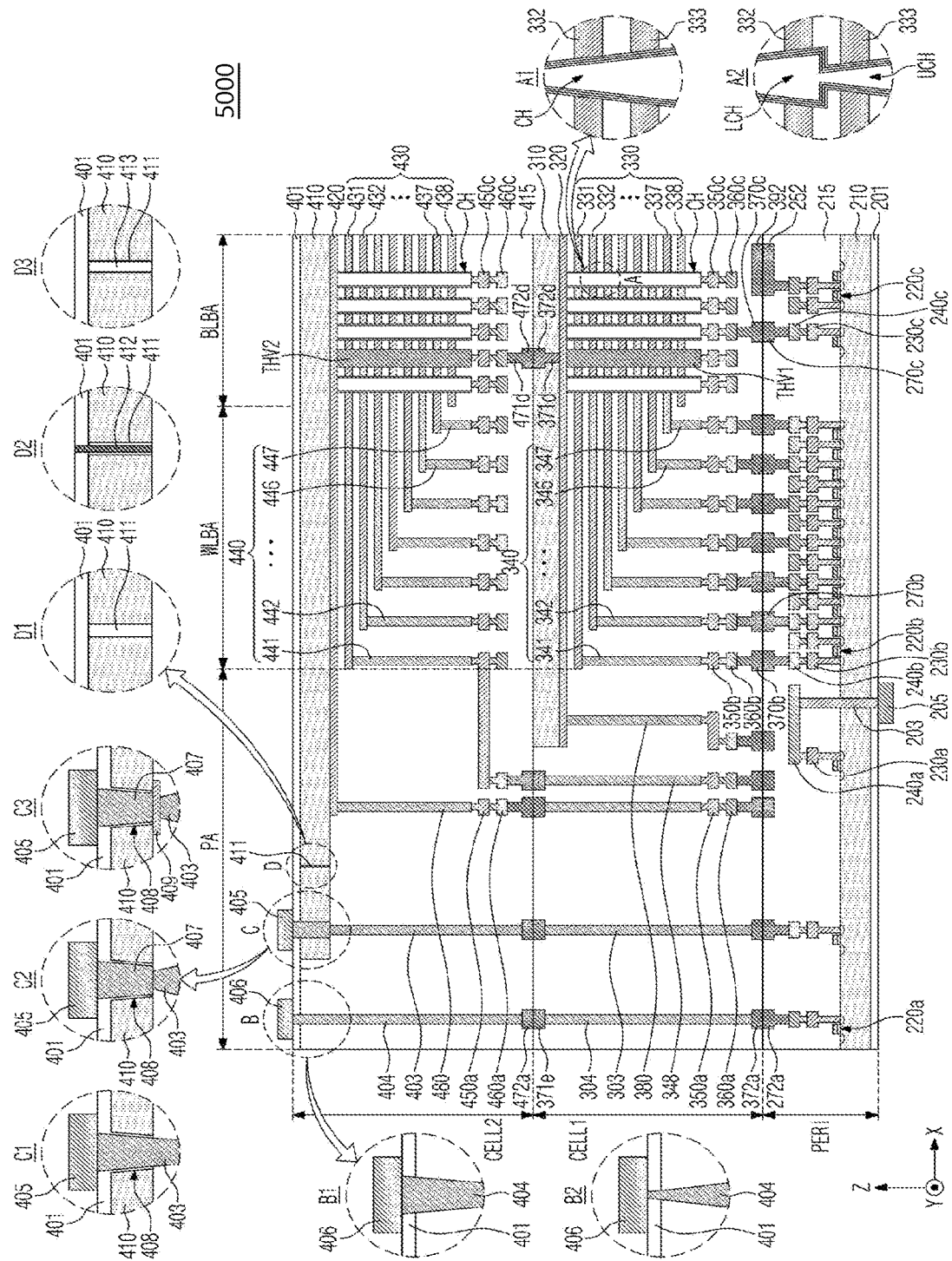
FIG. 17 is a view for describing a flash memory according to an embodiment of the present disclosure.

FIG. 17 is a view for describing a flash memory 500 according to an embodiment of the present disclosure. Referring to FIG. 17, the flash memory 5000 may have a chip-to-chip (C2C) structure. Herein, in the C2C structure, after fabricating at least one upper chip including a cell region CELL and at least one lower chip including a peripheral circuit region PERI, respectively, the upper chip and the lower chip may be bonded to each other by a bonding method.

As an example, the bonding method may mean a method of electrically or physically connecting a bonding metal pattern formed in the uppermost metal layer of the upper chip and a bonding metal pattern formed in the uppermost metal layer of the lower chip. For example, when the bonding metal patterns are formed of copper (Cu), the bonding method may be referred to as a "Cu—Cu bonding method". As another example, the bonding metal patterns may also be formed of aluminum (Al) or tungsten (W).

In the case in which the flash memory 500 is implemented to include two upper chips, the flash memory 500 may be manufactured by separately manufacturing a first upper chip including a first cell region CELL1, a second upper chip including a second cell region CELL2, and a lower chip including a peripheral circuit region PERI and thereafter connecting the first upper chip, the second upper chip, and the lower chip by a bonding method. The first upper chip may be turned over and connected to the lower chip by the bonding method, and the second upper chip may also be turned over and connected to the first upper chip by the bonding method. In the following description, upper portions and lower portions of the first and second upper chips are defined based on before the first upper chip and the second upper chip are turned over. That is, in FIG. 17, an upper portion of the lower chip refers to an upper portion defined based on a +Z-axis direction, and the upper portions of the first and second upper chips refer to upper portions defined based on a −Z-axis direction. However, this is illustrative, and only one of the first upper chip and the second upper chip may be turned over and connected by the bonding method.

Each of the peripheral circuit region PERI and the first and second cell regions CELL1 and CELL2 of the flash memory 500 may include an external pad bonding region PA, a word line bonding region WLBA, and a bit line bonding region BLBA.

The peripheral circuit region PERI may include a first substrate 210 and a plurality of circuit elements 220a, 220b, and 220c formed on the first substrate 210. An interlayer insulating layer 215 including one or more insulating layers may be provided on the plurality of circuit elements 220a, 220b, and 220c, and a plurality of metal lines connecting the plurality of circuit elements 220a, 220b, and 220c may be provided in the interlayer insulating layer 215. For example, the plurality of metal lines may include first metal lines 230a, 230b, and 230c connected with the plurality of circuit elements 220a, 220b, and 220c, respectively, and second metal lines 240a, 240b, and 240c formed on the first metal lines 230a, 230b, and 230c. The plurality of metal lines may be formed of at least one of various conductive materials. For example, the first metal lines 230a, 230b, and 230c may be formed of tungsten having a relatively high electrical resistivity, and the second metal lines 240a, 240b, and 240c may be formed of copper having a relatively low electrical resistivity.

In this specification, only the first metal lines 230a, 230b, and 230c and the second metal lines 240a, 240b, and 240c are illustrated and described. However, without being limited thereto, one or more additional metal lines may be further formed on the second metal lines 240a, 240b, and 240c. In this case, the second metal lines 240a, 240b, and 240c may be formed of aluminum At least some of the additional metal lines formed on the second metal lines 240a, 240b, and 240c may be formed of copper having a lower electrical resistivity than the aluminum of the second metal lines 240a, 240b, and 240c.

The interlayer insulating layer 115 may be disposed on the first substrate 210 and may include an insulating material, such as silicon oxide or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (the Z-axis direction) perpendicular to an upper surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked in a direction (the Z-axis direction) perpendicular to an upper surface of the third substrate 410. The second substrate 310 and the third substrate 410 may be formed of various materials and may be, for example, silicon substrates, silicon-germanium substrates, germanium substrates, or substrates having mono-crystalline epitaxial layers grown on mono-crystalline silicon substrates. A plurality of channel structures CH may be formed in the first and second cell regions CELL1 and CELL2.

In an embodiment, as illustrated in A1, the channel structure CH may be provided in the bit line bonding region BLBA and may extend in the direction perpendicular to the upper surface of the second substrate 310 to penetrate the word lines 330, the string selection lines, and the ground selection line. The channel structure CH may include a data storage layer, a channel layer, and a buried insulating layer. The channel layer may be electrically connected with a first metal line 350c and a second metal line 360c in the bit line bonding region BLBA. For example, the second metal line 360c may be a bit line and may be connected to the channel structure CH through the first metal line 350c. The bit line 360c may extend in a first direction (a Y-axis direction) parallel to the upper surface of the second substrate 310.

In an embodiment, as illustrated in A2, the channel structure CH may include a lower channel LCH and an upper channel UCH connected with each other. For example, the channel structure CH may be formed through a process for the lower channel LCH and a process for the upper channel UCH. The lower channel LCH may extend in the direction perpendicular to the upper surface of the second substrate 310 and may penetrate the common source line 320 and the lower word lines 331 and 332. The lower channel LCH may include a data storage layer, a channel layer, and a buried insulating layer and may be connected with the upper channel UCH. The upper channel UCH may penetrate the upper word lines 333 to 338. The upper channel UCH may include a data storage layer, a channel layer, and a buried insulating layer, and the channel layer of the upper channel UCH may be electrically connected with the first metal line 350c and the second metal line 360c. As the length of a channel is increased, it may be difficult to form a channel having a constant width due to process reasons. The flash memory 500 according to an embodiment of the present disclosure may include a channel having improved width uniformity through the lower channel LCH and the upper channel UCH formed by sequential processes.

In the case in which the channel structure CH includes the lower channel LCH and the upper channel UCH as illustrated in A2, a word line located near the boundary between the lower channel LCH and the upper channel UCH may be a dummy word line. For example, the word line 332 and the word line 333 that form the boundary between the lower channel LCH and the upper channel UCH may be dummy word lines. In this case, data may not be stored in memory cells connected to the dummy word lines. Alternatively, the number of pages corresponding to the memory cells connected to the dummy word lines may be smaller than the number of pages corresponding to memory cells connected to normal word lines. A voltage level applied to the dummy word lines may differ from a voltage level applied to the normal word lines, and thus an influence of a non-uniform channel width between the lower channel LCH and the upper channel UCH on an operation of the memory device may be reduced.

Meanwhile, it is illustrated in A2 that the number of lower word lines 331 and 332 penetrated by the lower channel LCH is smaller than the number of upper word lines 333 to 338 penetrated by the upper channel UCH. However, this is illustrative, and the present disclosure is not limited thereto. In another example, the number of lower word lines penetrated by the lower channel LCH may be equal to or larger than the number of upper word lines penetrated by the upper channel UCH. Furthermore, the above-described structure and connection relationship of the channel structure CH disposed in the first cell region CELL1 may be identically applied to the channel structure CH disposed in the second cell region CELL2.

In the bit line bonding region BLBA, a first through-electrode THV1 may be provided in the first cell region CELL1, and a second through-electrode THV2 may be provided in the second cell region CELL2. As illustrated in FIG. 17, the first through-electrode THV1 may penetrate the common source line 320 and the plurality of word lines 330. However, this is illustrative, and the first through-electrode THV1 may additionally penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In an embodiment, the first through-electrode THV1 and the second through-electrode THV2 may be electrically connected through a first through-metal pattern 372d and a second through-metal pattern 472d. The first through-metal pattern 372d may be formed on a lower side of the first upper chip including the first cell region CELL1, and the second through-metal pattern 472d may be formed on an upper side of the second upper chip including the second cell region CELL2. The first through-electrode THV1 may be electrically connected with the first metal line 350c and the second metal line 360c. A lower VIA 371d may be formed between the first through-electrode THV1 and the first through-metal pattern 372d, and an upper VIA 471d may be formed between the second through-electrode THV2 and the second through-metal pattern 472d. The first through-metal pattern 372d and the second through-metal pattern 472d may be connected with each other by a bonding method.

Furthermore, in the bit line bonding region BLBA, an upper metal pattern 252 may be formed on the uppermost metal layer of the peripheral circuit region PERI, and an upper metal pattern 392 having the same shape as the upper metal pattern 252 may be formed on the uppermost metal layer of the first cell region CELL1. The upper metal pattern 392 of the first cell region CELL1 and the upper metal pattern 252 of the peripheral circuit region PERI may be electrically connected with each other by a bonding method. In the bit line bonding region BLBA, the bit line 360c may be electrically connected with a page buffer included in the peripheral circuit region PERI. For example, some of the circuit elements 220c of the peripheral circuit region PERI may provide a page buffer, and the bit line 360c may be electrically connected with the circuit elements 220c providing the page buffer through an upper bonding metal 370c of the first cell region CELL1 and an upper bonding metal 270c of the peripheral circuit region PERI.

Continuously referring to FIG. 17, in the word line bonding region WLBA, the word lines 330 of the first cell region CELL1 may extend in a second direction (an X-axis direction) parallel to the upper surface of the second substrate 310 and may be connected with a plurality of cell contact plugs 340 (341 to 347). A first metal line 350b and a second metal line 360b may be sequentially connected to upper portions of the cell contact plugs 340 that are connected to the word lines 330. In the word line bonding region WLBA, the cell contact plugs 340 may be connected with the peripheral circuit region PERI through an upper bonding metal 370b of the first cell region CELL1 and an upper bonding metal 270b of the peripheral circuit region PERI.

The cell contact plugs 340 may be electrically connected with a row decoder included in the peripheral circuit region PERI. For example, some of the circuit elements 220b of the peripheral circuit region PERI may provide a row decoder, and the cell contact plugs 340 may be electrically connected with the circuit elements 220b providing the row decoder through the upper bonding metal 370b of the first cell region CELL1 and the upper bonding metal 270b of the peripheral circuit region PERI. In an embodiment, an operating voltage of the circuit elements 220b that provide the row decoder may differ from an operating voltage of the circuit elements 220c that provide the page buffer. For example, the operating voltage of the circuit elements 220c that provide the page buffer may be greater than the operating voltage of the circuit elements 220b that provide the row decoder.

Likewise, in the word line bonding region WLBA, the word lines 430 of the second cell region CELL2 may extend in the second direction (the X-axis direction) parallel to the upper surface of the third substrate 410 and may be connected with a plurality of cell contact plugs 440 (441 to 447). The cell contact plugs 440 may be connected with the peripheral circuit region PERI through an upper metal pattern of the second cell region CELL2, a lower metal pattern and an upper metal pattern of the first cell region CELL1, and a cell contact plug 348.

In the word line bonding region WLBA, the upper bonding metal 370b may be formed in the first cell region CELL1, and the upper bonding metal 270b may be formed in the peripheral circuit region PERI. The upper bonding metal 370b of the first cell region CELL1 and the upper bonding metal 270b of the peripheral circuit region PERI may be electrically connected with each other by a bonding method. The upper bonding metal 370*b* and the upper bonding metal 270*b* may be formed of aluminum, copper, or tungsten.

In the external pad bonding region PA, a lower metal pattern 371*e* may be formed on a lower portion of the first cell region CELL1, and an upper metal pattern 472*a* may be formed on an upper portion of the second cell region CELL2. The lower metal pattern 371*e* of the first cell region CELL1 and the upper metal pattern 472*a* of the second cell region CELL2 may be connected with each other by a bonding method in the external pad bonding region PA. Likewise, an upper metal pattern 372*a* may be formed on an upper portion of the first cell region CELL1, and an upper metal pattern 272*a* may be formed on an upper portion of the peripheral circuit region PERI. The upper metal pattern 372*a* of the first cell region CELL1 and the upper metal pattern 272*a* of the peripheral circuit region PERI may be connected with each other by a bonding method.

Common source line contact plugs 380 and 480 may be disposed in the external pad bonding region PA. The common source line contact plugs 380 and 480 may be formed of a conductive material, such as metal, a metal compound, or doped poly-silicon. The common source line contact plug 380 of the first cell region CELL1 may be electrically connected with the common source line 320, and the common source line contact plug 480 of the second cell region CELL2 may be electrically connected with the common source line 420. A first metal line 350*a* and a second metal line 360*a* may be sequentially stacked on an upper portion of the common source line contact plug 380 of the first cell region CELL1, and a first metal line 450*a* and a second metal line 460*a* may be sequentially stacked on an upper portion of the common source line contact plug 480 of the second cell region CELL2.

Input/output pads 205, 405, and 406 may be disposed in the external pad bonding region PA. Referring to FIG. 17, a lower insulating layer 201 may cover a lower surface of the first substrate 210, and the first input/output pad 205 may be formed on the lower insulating layer 201. The first input/output pad 205 may be connected with at least one of the plurality of circuit elements 220*a* that are disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 and may electrically isolate the first input/output contact plug 203 from the first substrate 210.

An upper insulating layer 401 may be formed on the third substrate 410 to cover the upper surface of the third substrate 410. The second input/output pad 405 and/or the third input/output pad 406 may be disposed on the upper insulating layer 401. The second input/output pad 405 may be connected with at least one of the plurality of circuit elements 220*a* that are disposed in the peripheral circuit region PERI through second input/output contact plugs 403 and 303, and the third input/output pad 406 may be connected with at least one of the plurality of circuit elements 220*a* that are disposed in the peripheral circuit region PERI through third input/output contact plugs 404 and 304.

In an embodiment, the third substrate 410 may not be disposed in the regions in which the input/output contact plugs are disposed. For example, as illustrated in B, the third input/output contact plug 404 may be separated from the third substrate 410 in a direction parallel to the upper surface of the third substrate 410, may penetrate an interlayer insulating layer 415 of the second cell region CELL2, and may be connected to the third input/output pad 406. In this case, the third input/output contact plug 404 may be formed through various processes.

For example, as illustrated in B1, the third input/output contact plug 404 may extend in the third direction (the Z-axis direction) and may have an increasing diameter toward the upper insulating layer 401. That is, while the channel structure CH described with reference to A1 has a decreasing diameter toward the upper insulating layer 401, the third input/output contact plug 404 may have an increasing diameter toward the upper insulating layer 401. For example, the third input/output contact plug 404 may be formed after the second cell region CELL2 and the first cell region CELL1 are coupled by a bonding method.

For example, as illustrated in B2, the third input/output contact plug 404 may extend in the third direction (the Z-axis direction) and may have a decreasing diameter toward the upper insulating layer 401. That is, likewise to the channel structure CH, the third input/output contact plug 404 may have a decreasing diameter toward the upper insulating layer 401. For example, the third input/output contact plug 404 may be formed together with the cell contact plugs 440 before the second cell region CELL2 and the first cell region CELL1 are coupled by a bonding method.

In an embodiment, an input/output contact plug may be disposed to overlap the third substrate 410. For example, as illustrated in C, the second input/output contact plug 403 may be formed through the interlayer insulating layer 415 of the second cell region CELL2 in the third direction (the Z-axis direction) and may be electrically connected to the second input/output pad 405 through the third substrate 410. In this case, a connection structure of the second input/output contact plug 403 and the second input/output pad 405 may be implemented in various ways.

For example, as illustrated in C1, an opening 408 may be formed through the third substrate 410, and the second input/output contact plug 403 may be directly connected to the second input/output pad 405 through the opening 408 formed in the third substrate 410. In this case, as illustrated in C1, the second input/output contact plug 403 may have an increasing diameter toward the second input/output pad 405. However, this is illustrative, and the second input/output contact plug 403 may have a decreasing diameter toward the second input/output pad 405.

For example, as illustrated in C2, the opening 408 may be formed through the third substrate 410, and a contact 407 may be formed in the opening 408. One end portion of the contact 407 may be connected to the second input/output pad 405, and an opposite end portion of the contact 407 may be connected to the second input/output contact plug 403. Accordingly, the second input/output contact plug 403 may be electrically connected to the second input/output pad 405 through the contact 407 in the opening 408. In this case, as illustrated in C2, the contact 407 may have an increasing diameter toward the second input/output pad 405, and the second input/output contact plug 403 may have a decreasing diameter toward the second input/output pad 405. For example, the third input/output contact plug 403 may be formed together with the cell contact plugs 440 before the second cell region CELL2 and the first cell region CELL1 are coupled by a bonding method, and the contact 407 may be formed after the second cell region CELL2 and the first cell region CELL1 are coupled by the bonding method.

For example, as illustrated in C3, a stopper 409 may be additionally formed on an upper surface of the opening 408 of the third substrate 410. The stopper 409 may be a metal line formed on the same layer as the common source line 420. However, this is illustrative, and the stopper 409 may be a metal line formed on the same layer as at least one of the word lines 430. The second input/output contact plug 403 may be electrically connected to the second input/output pad 405 through the contact 407 and the stopper 409.

Meanwhile, similarly to the second and third input/output contact plugs 403 and 404 of the second cell region CELL2, the second and third input/output contact plugs 303 and 304 of the first cell region CELL1 may have a decreasing diameter toward the lower metal pattern 371e, or may have an increasing diameter toward the lower metal pattern 371e.

Meanwhile, in some embodiments, a slit 411 may be formed in the third substrate 410. For example, the slit 411 may be formed at any position in the external pad bonding region PA. For example, as illustrated in D, the slit 411 may be located between the second input/output pad 405 and the cell contact plugs 440 when viewed on a plane. However, this is illustrative, and the slit 411 may be formed such that the second input/output pad 405 is located between the slit 411 and the cell contact plugs 440 when viewed on the plane.

For example, as illustrated in D1, the slit 411 may be formed through the third substrate 410. For example, the slit 411 may be used to prevent the third substrate 410 from being finely cracked when the opening 408 is formed. However, this is illustrative, and the slit 411 may be formed to have a depth ranging from about 60% to about 70% of the thickness of the third substrate 410.

For example, as illustrated in D2, a conductive material 412 may be formed in the slit 411. For example, the conductive material 412 may be used to discharge a leakage current generated while circuit elements in the external pad bonding region PA are driven. In this case, the conductive material 412 may be connected to an external ground line.

For example, as illustrated in D3, an insulating material 413 may be formed in the slit 411. For example, the insulating material 413 may be formed to electrically isolate the second input/output pad 405 and the second input/output contact plug 403 disposed in the external pad bonding region PA from the word line bonding region WLBA. An influence of a voltage provided through the second input/output pad 405 on a metal layer disposed on the third substrate 410 in the word line bonding region WLBA may be interrupted by forming the insulating material 413 in the slit 411.

Meanwhile, in some embodiments, the first to third input/output pads 205, 405, and 406 may be selectively formed. For example, the flash memory 500 may be implemented to include only the first input/output pad 205 disposed on the first substrate 210, only the second input/output pad 405 disposed on the third substrate 410, or only the third input/output pad 406 disposed on the upper insulating layer 401.

Meanwhile, in some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the peripheral circuit region PERI and the first cell region CELL1 are bonded to each other, and an insulating layer for covering an upper surface of the common source line 320 or a conductive layer for connection may be formed. Similarly, the third substrate 410 of the second cell region CELL2 may be removed before or after the first cell region CELL1 and the second cell region CELL2 are bonded to each other, and the upper insulating layer 401 for covering an upper surface of the common source line 420 or a conductive layer for connection may be formed.

According to the present disclosure, internal elements of a charge pump may be protected from the breakdown or leakage in a sudden power-off event.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A charge pump of a flash memory, comprising:
an output terminal;
a first stage pump connected between the output terminal and a first pump node; and
a second stage pump connected between the first pump node and a second pump node,
wherein the first stage pump includes:
a first switch circuit connected between a power terminal and the first pump node; and
a first pump circuit connected to the first pump node and configured to:
generate a first pumping voltage by using a voltage of the first pump node in response to a first clock signal; and
provide the first pumping voltage to the output terminal, and
wherein the first switch circuit is configured to:
provide, in a normal operation, a power supply voltage from the power terminal to the first pump node in response to a first stage signal; and
block, in a sudden power-off event, a current flow from the first pump node to the power terminal.
2. The charge pump of claim 1,
wherein the first switch circuit includes:
an NMOS transistor and a depletion NMOS transistor connected in series between the power terminal and the first pump node, and
wherein the NMOS transistor and the depletion NMOS transistor provide, in the normal operation, the power supply voltage from the power terminal to the first pump node in response to the first stage signal, and block the current flow in the sudden power-off event.
3. The charge pump of claim 2,
wherein the first switch circuit further includes:
an inverter including an output that is connected to a gate of the NMOS transistor and a gate of the depletion NMOS transistor, and
wherein the first stage signal is provided to an input of the inverter, and
wherein the inverter is connected between the power terminal and a ground terminal.
4. The charge pump of claim 3,
wherein the depletion NMOS transistor is a high-voltage transistor having endurance against a higher voltage than the power supply voltage.
5. The charge pump of claim 2,
wherein the first switch circuit further includes:
a level shifter that is connected to a gate of the NMOS transistor and a gate of the depletion NMOS transistor, and
wherein the first stage signal is provided to the level shifter.

6. The charge pump of claim 5,
wherein the depletion NMOS transistor is a high-voltage transistor having endurance against a higher voltage than the power supply voltage.
7. The charge pump of claim 1,
wherein the second stage pump includes:
   a second switch circuit connected between the power terminal and the second pump node; and
   a second pump circuit connected to the second pump node and configured to:
      generate a second pumping voltage by using a voltage of the second pump node in response to a second clock signal; and
      provide the second pumping voltage to the first pump node, and
wherein the second switch circuit is configured to:
   provide, in the normal operation, the power supply voltage from the power terminal to the second pump node in response to a second stage signal; and
   block, in the sudden power-off event, a current flow from the second pump node to the power terminal.
8. The charge pump of claim 7,
wherein the second switch circuit includes:
   an NMOS transistor and a depletion NMOS transistor connected in series between the power terminal and the second pump node, and
wherein the NMOS transistor and the depletion NMOS transistor provide, in the normal operation, the power supply voltage from the power terminal to the second pump node in response to the second stage signal, and block the current flow in the sudden power-off event.
9. The charge pump of claim 1, further comprising:
a discharge circuit connected between the output terminal and the power terminal,
wherein the discharge circuit discharges charges of the output terminal to the power terminal in the sudden power-off event.
10. The charge pump of claim 9,
wherein the discharge circuit includes:
   a depletion NMOS transistor and an NMOS transistor connected in series between the output terminal and the power terminal, and
wherein the depletion NMOS transistor and the NMOS transistor form a discharge path between the output terminal and the power terminal in the sudden power-off event.
11. A flash memory comprising:
a charge pump including a plurality of stage pumps that are configured to generate an output voltage; and
a word line voltage generator connected to the charge pump and configured to generate a word line voltage by using the output voltage of the charge pump,
wherein each stage pump of the plurality of stage pumps includes:
   a pump circuit configured to generate a pumping voltage in response to a clock signal; and
   a switch circuit connected between a power terminal and the pump circuit, and
wherein the switch circuit is configured to:
   provide, in a normal operation, a power supply voltage to the pump circuit in response to a stage signal; and
   block, in a sudden power-off event, a current flow from the pump circuit to the power terminal.
12. The flash memory of claim 11,
wherein the charge pump further includes:
   a discharge circuit connected with an output terminal of the charge pump, and
wherein the discharge circuit discharges charges of the output terminal to the power terminal in the sudden power-off event.
13. The flash memory of claim 12,
wherein the discharge circuit includes:
   a depletion NMOS transistor and an NMOS transistor connected in series between an output terminal of the charge pump and the power terminal, and
wherein the depletion NMOS transistor and the NMOS transistor form a discharge path between the output terminal and the power terminal in the sudden power-off event.
14. The flash memory of claim 11,
wherein the charge pump includes:
   a first stage pump connected between an output terminal of the charge pump and a first pump node; and
   a second stage pump connected between the first pump node and a second pump node,
wherein the first stage pump includes:
   a first switch circuit connected between the power terminal and the first pump node; and
   a first pump circuit connected to the first pump node,
wherein the first pump circuit is configured to:
   generate a first pumping voltage by using a voltage of the first pump node in response to a first clock signal; and
   provide the first pumping voltage to the output terminal, and
wherein the first switch circuit is configured to:
   provide, in the normal operation, the power supply voltage to the first pump node in response to a first stage signal; and
   block, in a sudden power-off event, a current flow from the first pump node to the power terminal.
15. The flash memory of claim 14,
wherein the first switch circuit includes:
   an NMOS transistor and a depletion NMOS transistor connected in series between the power terminal and the first pump node, and
wherein the NMOS transistor and the depletion NMOS transistor provide, in the normal operation, the power supply voltage from the power terminal to the first pump node in response to the first stage signal, and block, in the sudden power-off event, the current flow from the first pump node to the power terminal.
16. The flash memory of claim 15,
wherein the depletion NMOS transistor is a high-voltage transistor having endurance against a higher voltage than the power supply voltage.
17. The flash memory of claim 14,
wherein the second stage pump includes:
   a second switch circuit connected between the power terminal and the second pump node; and
   a second pump circuit connected to the second pump node,
wherein the second pump circuit is configured to:
   generate a second pumping voltage by using a voltage of the second pump node in response to a second clock signal; and
   provide the second pumping voltage to the first pump node, and
wherein the second switch circuit is configured to:
   provide, in the normal operation, the power supply voltage from the power terminal to the second pump node in response to a second stage signal; and
   block, in the sudden power-off event, a current flow from the second pump node to the power terminal.

18. The flash memory of claim 17,
wherein the second switch circuit includes:
an NMOS transistor and a depletion NMOS transistor connected in series between the power terminal and the second pump node, and
wherein the NMOS transistor and the depletion NMOS transistor provide, in the normal operation, the power supply voltage from the power terminal to the second pump node in response to the second stage signal, and block, in the sudden power-off event, the current flow from the second pump node to the power terminal.

19. A storage device comprising:
a flash memory including a memory cell array and a peripheral circuit; and
a memory controller configured to control the flash memory,
wherein the peripheral circuit of the flash memory includes:
a charge pump including a plurality of stage pumps that are configured to generate an output voltage; and
a word line voltage generator connected to the charge pump,
wherein the word line voltage generator is configured to:
generate a word line voltage by using an output voltage of the charge pump; and
provide the word line voltage to the memory cell array,
wherein each stage pump of the plurality of stage pumps includes:
a pump circuit configured to generate a pumping voltage in response to a clock signal; and
a switch circuit connected between a power terminal of the charge pump and the pump circuit, and
wherein the switch circuit is configured to:
provide, in a normal operation, a power supply voltage to the pump circuit in response to a stage signal; and
block, in a sudden power-off event, a current flow from the pump circuit to the power terminal.

20. The storage device of claim 19,
wherein the charge pump further includes:
a discharge circuit connected with an output terminal of the charge pump, and
wherein the discharge circuit discharges charges of the output terminal to the power terminal in the sudden power-off event.

* * * * *